US012615828B2

(12) United States Patent
Katou et al.

(10) Patent No.: US 12,615,828 B2
(45) Date of Patent: Apr. 28, 2026

(54) SEMICONDUCTOR DEVICE HAVING DOT-SHAPED FIELD PLATE ELECTRODE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hiroaki Katou, Nonoichi Ishikawa (JP); Katsura Miyashita, Naka Kanagawa (JP); Saya Shimomura, Komatsu Ishikawa (JP); Tsuyoshi Kachi, Kanazawa Ishikawa (JP); Tatsuya Nishiwaki, Yokohama Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 563 days.

(21) Appl. No.: 18/077,856

(22) Filed: Dec. 8, 2022

(65) Prior Publication Data

US 2024/0079460 A1 Mar. 7, 2024

(30) Foreign Application Priority Data

Sep. 2, 2022 (JP) ................................. 2022-140260

(51) Int. Cl.
  *H10D 64/00* (2025.01)
  *H10D 30/66* (2025.01)
  *H10D 64/27* (2025.01)
(52) U.S. Cl.
  CPC ......... *H10D 64/112* (2025.01); *H10D 30/668* (2025.01); *H10D 64/117* (2025.01); *H10D 64/519* (2025.01)

(58) Field of Classification Search
  CPC ........ H10D 64/111–117; H10D 64/519; H10D 30/668; H10D 30/0297
  See application file for complete search history.

(56) References Cited

U.S. PATENT DOCUMENTS 6,956,264 B2 10/2005 Hijzen et al.
10,236,377 B2 3/2019 Katoh et al.
(Continued)

FOREIGN PATENT DOCUMENTS

JP H11-163342 B2 6/1999
JP 2010-537428 A 12/2010
(Continued)

OTHER PUBLICATIONS

Wang et al. "Narrow Gate Trench Power MOSFETs with Stepped Field Plate and Polysilicon Bridge," 2020 IEEE 15th International Conference on Solid-State & Integrated Circuit Technology (ICSICT), 2020, pp. 1-3, doi: 10.1109/ICSICT49897.2020.9278189.
(Continued)

*Primary Examiner* — Steven B Gauthier
*Assistant Examiner* — Candice Chan
(74) *Attorney, Agent, or Firm* — Kim & Stewart LLP

(57) ABSTRACT

A semiconductor device includes a first electrode, a second electrode located on the first electrode, a semiconductor part located between the first electrode and the second electrode, a first interconnect located between the semiconductor part and the second electrode, a third electrode located in the semiconductor part and separated from the semiconductor part, a fourth electrode located lower than the third electrode in the semiconductor part, a first plug connecting the second electrode to the fourth electrode, and a second plug. The third electrode includes a ring portion, and an extension portion extending from the ring portion into an interior of the ring portion. The fourth electrode is located in the interior of (Continued)

the ring portion in a plane perpendicular to a vertical direction. The fourth electrode is separated from the semiconductor part. The second plug connects the first interconnect to the extension portion.

14 Claims, 19 Drawing Sheets

(56) References Cited

U.S. PATENT DOCUMENTS

| | | |
|---|---|---|
| 2009/0050959 A1 | 2/2009 | Madson |
| 2012/0241761 A1 | 9/2012 | Asahara |
| 2014/0008722 A1 | 1/2014 | Mariani et al. |
| 2016/0322489 A1 | 11/2016 | Siemieniec et al. |
| 2017/0263768 A1* | 9/2017 | Katoh ................. H10D 62/393 |
| 2021/0057574 A1* | 2/2021 | Nishiwaki ........... H10D 62/127 |
| 2021/0083103 A1 | 3/2021 | Katou et al. |

FOREIGN PATENT DOCUMENTS

| | | | |
|---|---|---|---|
| JP | 2011-187970 | A | 9/2011 |
| JP | 2012-204590 | A | 10/2012 |
| JP | 6416142 | B2 | 10/2018 |
| JP | 6424684 | B2 | 11/2018 |
| JP | 2021034540 | A | 3/2021 |
| JP | 2021044470 | A | 3/2021 |
| JP | 2022-022074 | A | 2/2022 |

OTHER PUBLICATIONS

Notice of Reasons for Refusal (Office Action) mailed Jun. 19, 2025 in counterpart Japanese Patent Application No. 2022-140260 with English machine translation, 14 pages.

* cited by examiner

SEMICONDUCTOR DEVICE HAVING DOT-SHAPED FIELD PLATE ELECTRODE

CROSS-REFERENCE TO RELATED APPLICATIONS

This application is based upon and claims the benefit of priority from Japanese Patent Application No. 2022-140260, filed on Sep. 2, 2022; the entire contents of which are incorporated herein by reference.

FIELD

Embodiments relate to a semiconductor device.

BACKGROUND

A known semiconductor device includes dot-shaped field plate electrodes (hereinbelow, called "FP electrodes") to be able to increase the breakdown voltage or reduce the on-resistance. It is desirable to reduce the parasitic capacitance of such a semiconductor device to increase the operation speed.

BRIEF DESCRIPTION OF THE DRAWINGS

FIGS. 15A to 16C are process cross-sectional views showing a method for manufacturing a semiconductor device according to an eight embodiment; and FIGS. 17A to 19C are process cross-sectional views showing a method for manufacturing a semiconductor device according to a ninth embodiment.

DETAILED DESCRIPTION

In general, according to one embodiment, a semiconductor device includes a first electrode, a second electrode located on the first electrode, a semiconductor part located between the first electrode and the second electrode, a first interconnect located between the semiconductor part and the second electrode, a third electrode located in the semiconductor part and separated from the semiconductor part, a fourth electrode located lower than the third electrode in the semiconductor part, a first plug connecting the second electrode to the fourth electrode, and a second plug. The third electrode includes a ring portion, and an extension portion extending from the ring portion into an interior of the ring portion. The fourth electrode is located in the interior of the ring portion in a plane perpendicular to a vertical direction. The fourth electrode is separated from the semiconductor part. The second plug connects the first interconnect to the extension portion.

First Embodiment

Figure 1:
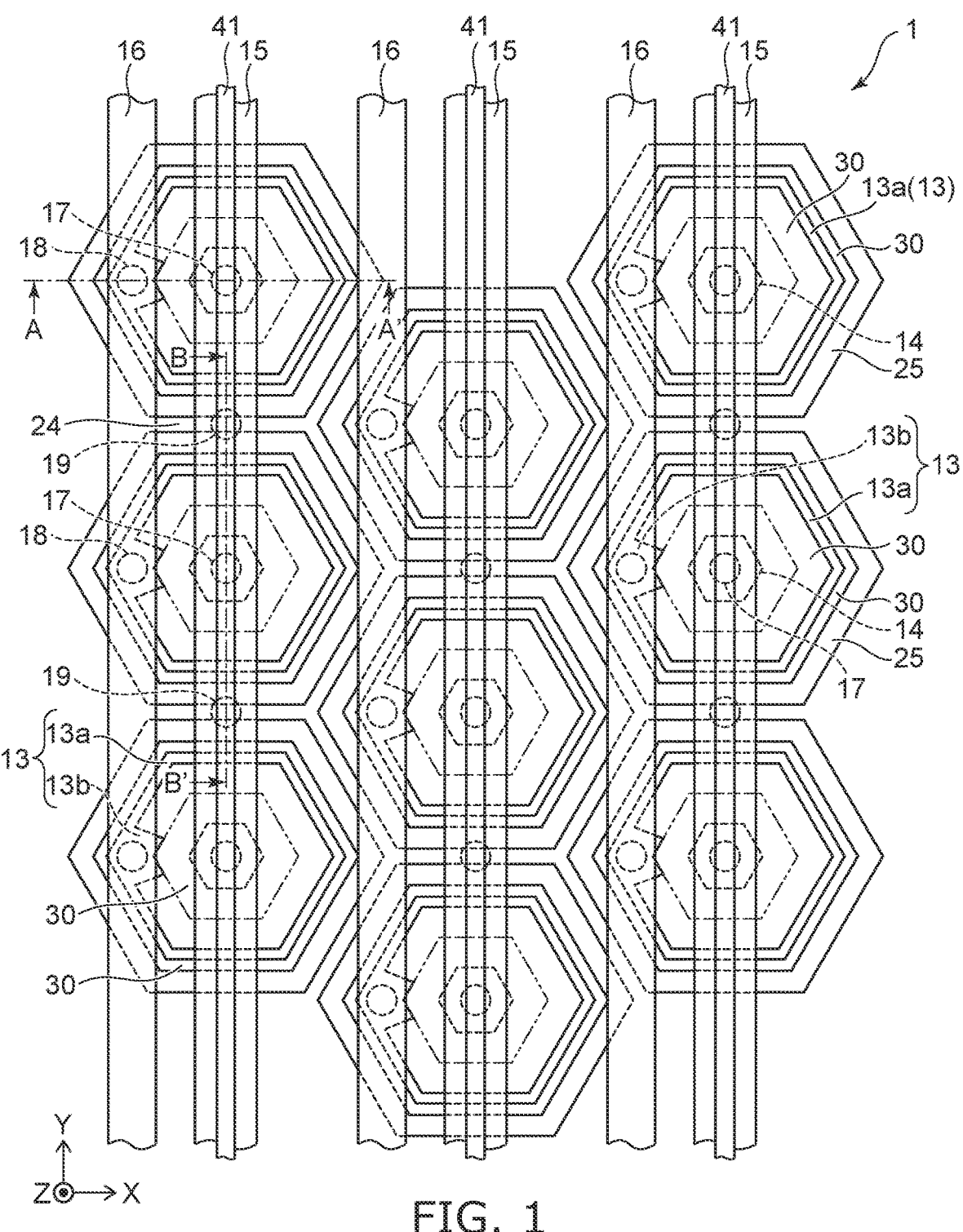
FIG. 1 is a top view showing a semiconductor device according to a first embodiment.

FIG. 1 is a top view showing a semiconductor device according to the embodiment.

Figure 2:
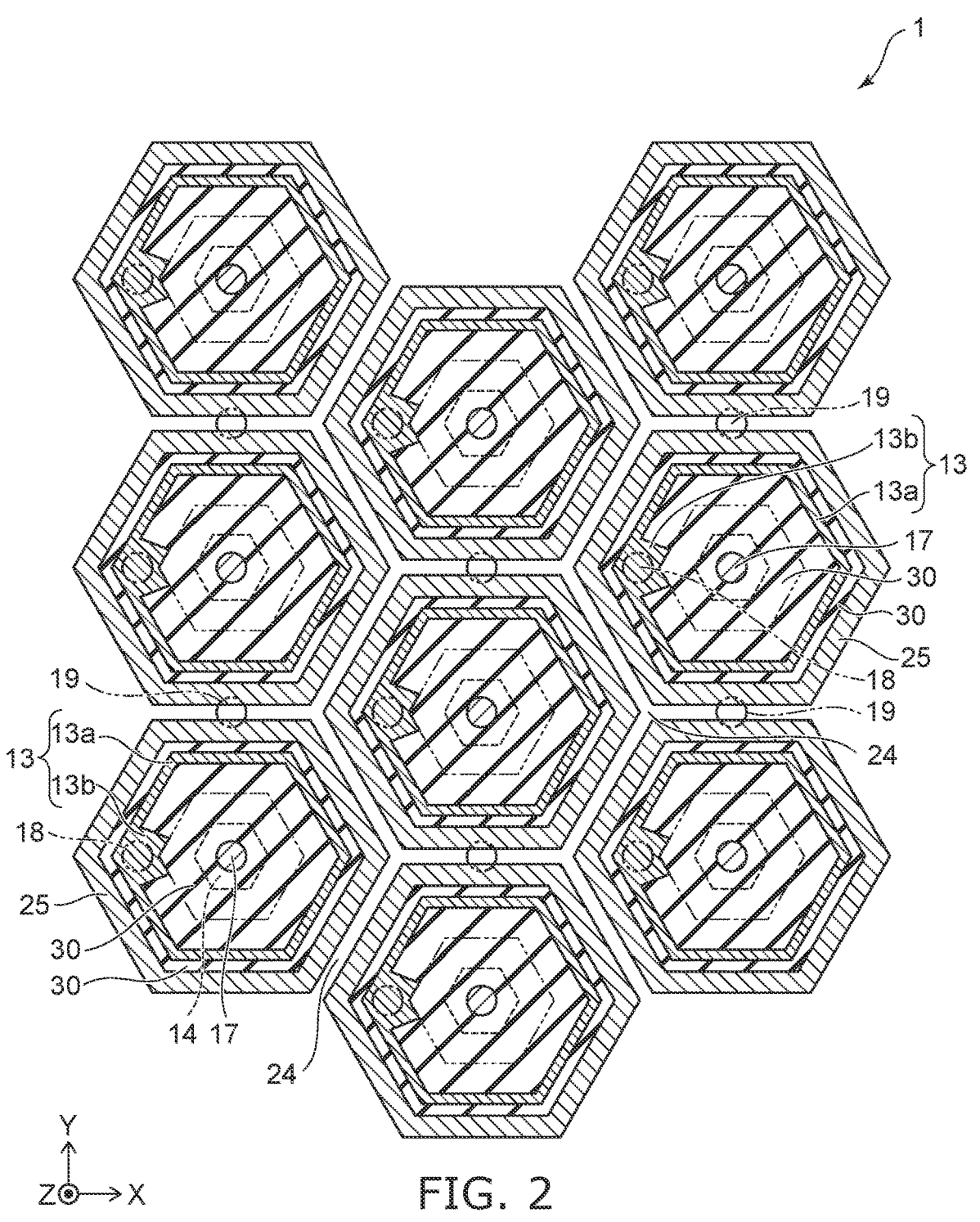
FIG. 2 is a cross-sectional view showing the semiconductor device according to the first embodiment when viewed from above.

FIG. 2 is a cross-sectional view showing the semiconductor device according to the embodiment when viewed from above.

Figure 3:
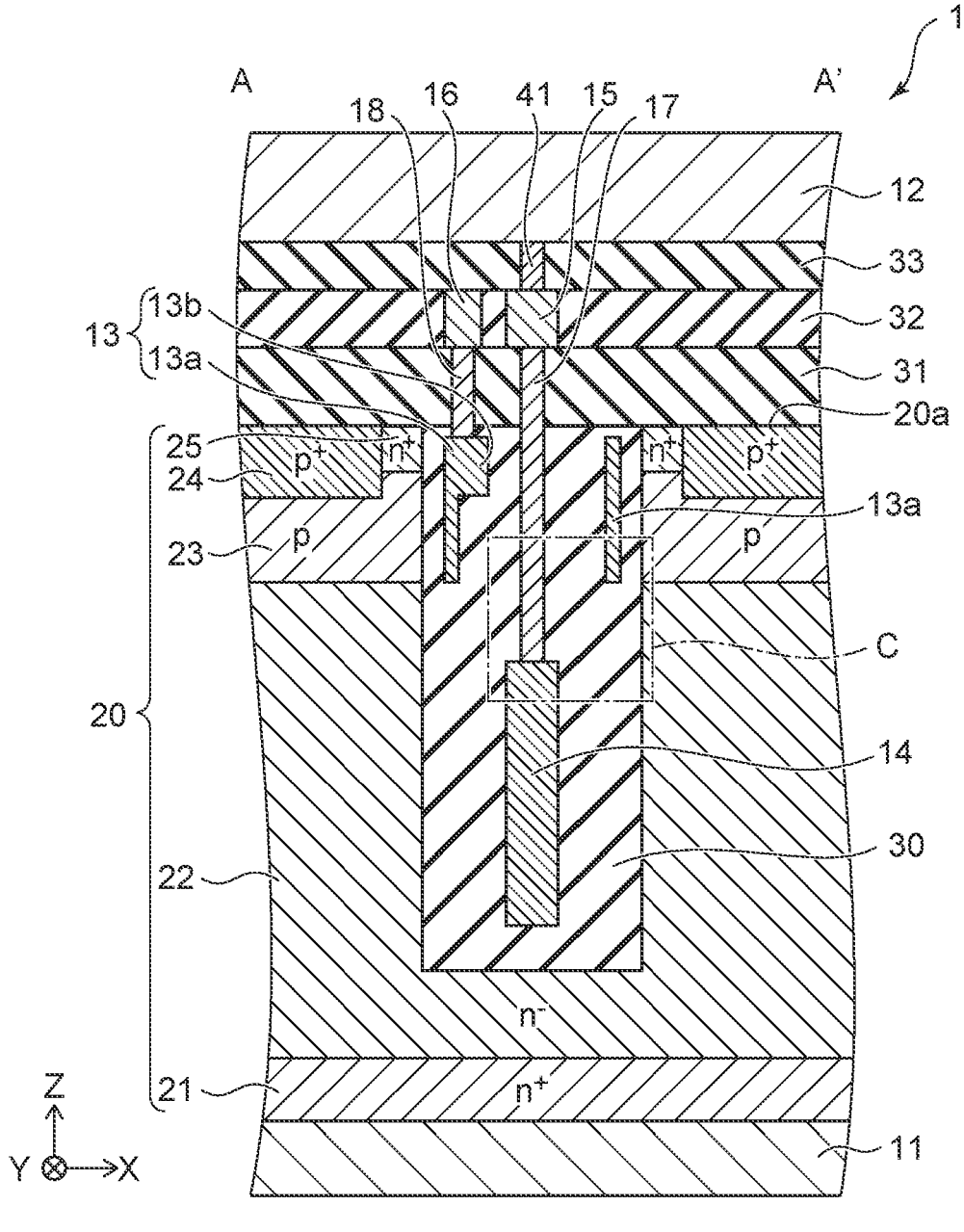
FIG. 3 is a cross-sectional view along line A-A' shown in FIG. 1.

FIG. 3 is a cross-sectional view along line A-A' shown in FIG. 1.

Figure 4:
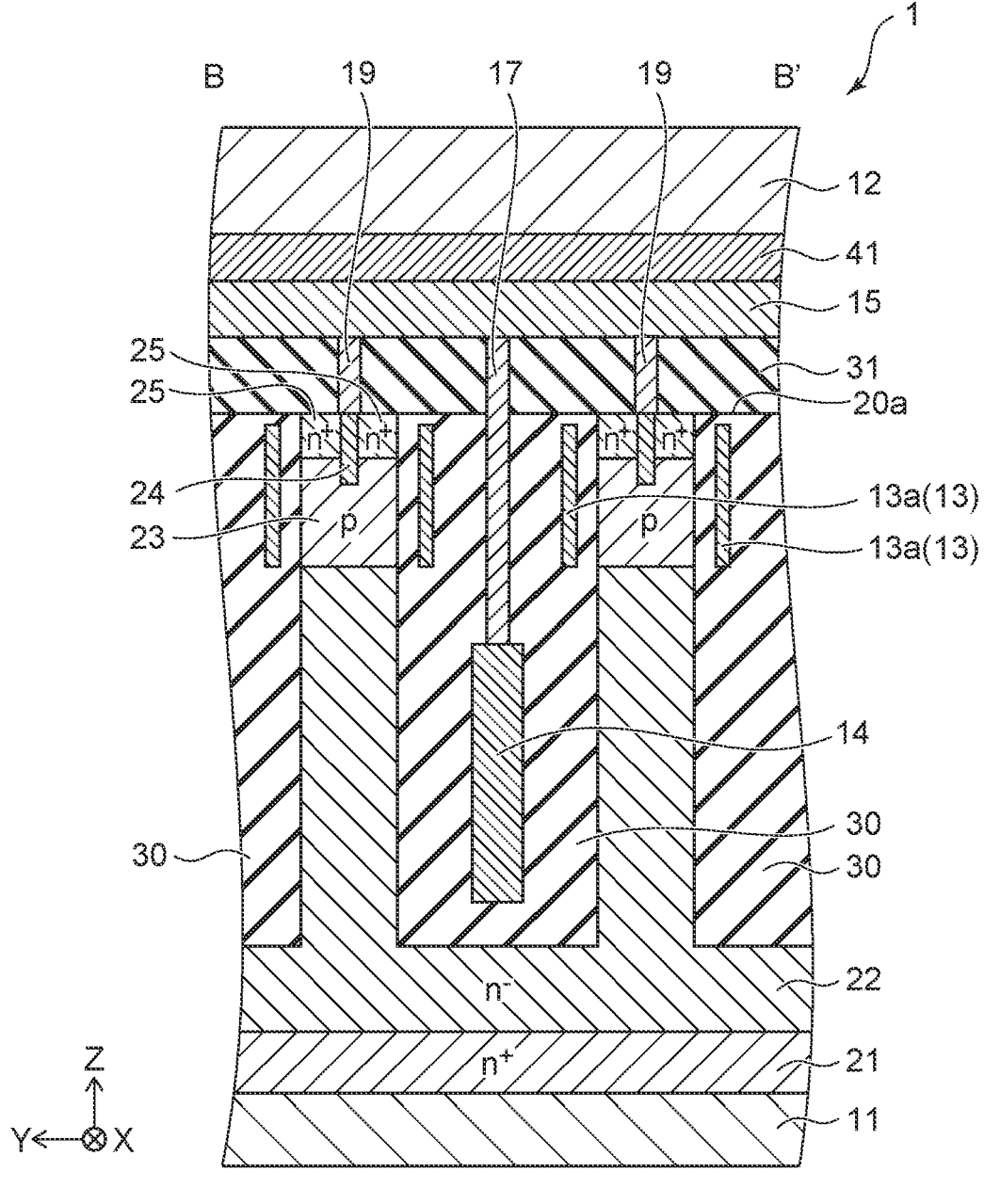
FIG. 4 is a cross-sectional view along line B-B' shown in FIG. 1.

FIG. 4 is a cross-sectional view along line B-B' shown in FIG. 1.

The drawings are schematic and are simplified and enhanced as appropriate. The dimensional ratios of the components do not always match between the drawings. This is similar for the other drawings described below as well.

As shown in FIGS. 1 to 4, the semiconductor device 1 according to the embodiment includes a drain electrode 11, a source electrode 12, a gate electrode 13, a FP electrode 14, a source interconnect 15, a gate interconnect 16, a FP plug 17, a gate plug 18, a source plug 19, a semiconductor part 20, an insulating member 30, an insulating film 31, an insulating film 32, an insulating film 33, and a connection part 41. The gate electrode 13 includes a ring portion 13a, and an extension portion 13b extending from the ring portion into the interior of the ring portion 13a. The source electrode 12 is not illustrated in FIG. 1. FIG. 2 shows a cross section at an upper surface 20a of the semiconductor part 20; and the members that are located higher than the upper surface 20a are not illustrated or are shown by double dot-dash lines.

In the specification hereinbelow, an XYZ orthogonal coordinate system is employed for convenience of description. The direction in which the drain electrode 11 and the source electrode 12 are arranged is taken as a "Z-direction"; the direction in which the source interconnect 15 and the gate interconnect 16 extend is taken as a "Y-direction"; and a direction orthogonal to the Z-direction and the Y-direction is taken as an "X-direction". Among the Z-directions, a direction that is from the drain electrode 11 toward the source electrode 12 also is called "up", and the opposite direction also is called "down"; however, these expressions are for convenience and are independent of the direction of gravity. In the specification, "when viewed from above" means in a plane (the XY plane) perpendicular to the vertical direction (the Z-direction). Such a plane may be a virtual plane.

The drain electrode 11 is provided over the entire surface or substantially the entire surface of the lower surface of the semiconductor device 1. The source electrode 12 is provided over substantially the entire region of the upper surface of the semiconductor device 1 other than a gate pad (not illustrated). The semiconductor part 20 is located between the drain electrode 11 and the source electrode 12. The source interconnect 15, the gate interconnect 16, and the insulating film 32 are located between the semiconductor part 20 and the source electrode 12. The source interconnect 15 and the gate interconnect 16 are located in the insulating film 32 and extend through the insulating film 32 in the Z-direction.

The insulating film 31 is located between the semiconductor part 20 and the insulating film 32. The insulating film 33 and the connection part 41 are located between the source interconnect 15, the gate interconnect 16, and the source electrode 12. In other words, the drain electrode 11, the semiconductor part 20, the insulating film 31, the insulating film 32, the insulating film 33, and the source electrode 12 are arranged in this order upward from below in the semiconductor device 1. The source interconnect 15 and the gate interconnect 16 are located in the insulating film 32. The source interconnect and the gate interconnect 16 extend in the Y-direction. The connection part 41 is located in the insulating film 33. The connection part 41 extends in the Y-direction.

For example, the semiconductor part 20 is formed of a semiconductor material such as silicon (Si), etc.; and the conductivity types of the portions are provided by locally including impurities. The semiconductor part 20 includes an $n^+$-type drain layer 21, an $n^-$-type drift layer 22, a p-type base layer 23, a $p^+$-type contact layer 24, and an $n^+$-type source layer 25. The "$n^+$-type" refers to a higher carrier concentration than the "$n^-$-type"; and the "$p^+$-type" refers to a higher carrier concentration than the "p-type". The "carrier concentration" is the effective impurity concentration functioning as a donor or an acceptor.

The drain layer 21 is connected to the drain electrode 11. In the specification, "connected" means an electrical connection. The drift layer 22 is located on the drain layer 21 and contacts the drain layer 21. The base layer 23 is located on the drift layer 22 and contacts the drift layer 22. The contact layer 24 is located on a portion of the base layer 23 and contacts the base layer 23. The source layer 25 is located on another portion of the base layer 23 and contacts the base layer 23 and the contact layer 24. In FIG. 2, the hatching of the contact layer 24 is not illustrated for easier viewing of the drawing.

The insulating member 30 is located in the semiconductor part 20; and the upper surface of the insulating member 30 is exposed at the upper surface 20a of the semiconductor part 20. The shape of the insulating member 30 is a columnar shape having an axial direction in the Z-direction, and is, for example, hexagonal prismatic, e.g., regular hexagonal prismatic. The diameter of the insulating member 30 may decrease downward. The outer edge of the upper surface of the insulating member 30 is formed by a pair of line segments extending in the X-direction, a pair of line segments extending in a direction tilted +60 degrees with respect to the X-direction, and a pair of line segments extending in a direction tilted −60 degrees with respect to the X-direction.

The multiple insulating members 30 are separated from each other in the semiconductor part 20. The multiple insulating members 30 are periodically arranged so that mutually-parallel side surfaces of the insulating members 30 are next to each other in the Y-direction, next to each other in a direction tilted +60 degrees with respect to the Y-direction, and next to each other in a direction tilted −60 degrees with respect to the Y-direction. One gate electrode 13, one FP electrode 14, and the lower portion of the one FP plug 17 are located in each insulating member 30. Although the configuration inside one insulating member 30 is described hereinbelow, this is similar for the other insulating members 30 as well.

The gate electrode 13 is located in the insulating member 30, and is therefore located in the semiconductor part 20. The gate electrode 13 is separated from the semiconductor part 20 by the insulating member 30. The ring portion 13a of the gate electrode 13 has a hexagonal tubular shape when viewed from above. Accordingly, the outer edge of the ring portion 13a is hexagonal when viewed from above. The thickness in the radial direction of the ring portion 13a is, for example, not less than 10 nm and not more than 50 nm, and more favorably not less than nm and not more than 30 nm.

The extension portion 13b of the gate electrode 13 extends from the upper portion of the inner side surface of the ring portion 13a into the interior of the ring portion 13a. For example, only one extension portion 13b is included in the gate electrode 13; and the extension portion 13b extends in the X-direction from one corner of the ring portion 13a. The ring portion 13a faces, via the insulating member 30, the upper portion of the drift layer 22, the entire base layer 23 in the Z-direction, and the lower portion of the source layer 25 of the semiconductor part 20.

The FP electrode 14 is located in the insulating member 30, and therefore is located in the semiconductor part 20. The FP electrode 14 is located lower than the gate electrode 13. In other words, the upper end of the FP electrode 14 is positioned lower than the lower end of the gate electrode 13, that is, at the drain electrode 11 side. When viewed from above, the FP electrode 14 is located in the interior of the ring portion 13a of the gate electrode 13. The FP electrode 14 is separated from the semiconductor part 20 by the insulating member 30. For example, the FP electrode 14 has a hexagonal prism shape.

The FP plug 17 extends in the Z-direction. The lower portion of the FP plug 17 is located in the insulating member 30; and the lower end of the FP plug 17 is connected to the upper surface of the FP electrode 14. The upper portion of the FP plug 17 is located in the insulating film 31; and the upper end of the FP plug 17 is connected to the lower surface of the source interconnect 15. Thereby, the FP plug 17 connects the FP electrode 14 to the source interconnect 15. The FP plug 17 is narrower than the FP electrode 14. When viewed from above, the FP plug 17 is located inside the FP electrode 14. The FP plug 17 may have the same diameter as the FP electrode 14. In other words, it is sufficient for the outer edge of the FP plug 17 to be aligned with the outer edge of the FP electrode 14 or located inward of the outer edge of the FP electrode 14 when viewed from above. Although the portion of the gate electrode 13 most proximate to the FP plug 17 is the tip of the extension portion 13b, the tip of the extension portion 13b does not reach the FP plug 17 and is separated from the FP plug 17 by the insulating member 30.

The upper surface of the source interconnect 15 is connected to the lower end of the connection part 41. The upper end of the connection part 41 is connected to the lower surface of the source electrode 12. Thereby, the connection part 41 connects the source interconnect 15 to the source electrode 12. Accordingly, the FP electrode 14 is connected to the source electrode 12 via the FP plug 17, the source interconnect 15, and the connection part 41. The connection part 41 has a band shape extending in the Y-direction.

The gate plug 18 is located in the insulating film 31 and extends in the Z-direction. The lower end of the gate plug 18 is connected to the upper surface of the extension portion 13b of the gate electrode 13; and the upper end of the gate plug 18 is connected to the lower surface of the gate interconnect 16. Thereby, the gate plug 18 connects the gate interconnect 16 to the gate electrode 13. The FP plug 17 and the gate plug 18 are arranged along the X-direction. The gate interconnect 16 extends in the Y-direction and is connected to a gate pad (not illustrated).

The source plug 19 is located in the insulating film 31 and extends in the Z-direction. When viewed from above, the source plug 19 is located between insulating members 30 that are next to each other in the Y-direction. The lower end of the source plug 19 is connected to the contact layer 24 and the source layer of the semiconductor part 20; and the upper end of the source plug 19 is connected to the source interconnect 15. The FP plug 17 and the source plug 19 are arranged along the Y-direction.

The contact layer 24, the source layer 25, and the insulating member 30 are exposed at the upper surface 20a of the semiconductor part 20. The gate electrode 13 may or may not be exposed at the upper surface 20a of the semiconductor part 20. As described above, the outer edge of the insulating member 30 is hexagonal when viewed from above. The source layer 25 surrounds the insulating member 30. Therefore, the source layer 25 has a hexagonal ring configuration when viewed from above. The contact layer 24 is located between the insulating members 30 that are next to each other. Therefore, the contact layer 24 has a honeycomb shape when viewed from above.

Examples of materials will now be described. For example, the insulating member 30, the insulating film 31, the insulating film 32, and the insulating film 33 are formed of an insulating material such as silicon oxide (SiO), etc. The drain electrode 11, the source electrode 12, the source interconnect 15, and the gate interconnect 16 are formed of aluminum (Al) or copper (Cu). The gate electrode 13 and the FP electrode 14 are formed of polysilicon that includes an impurity. The FP electrode 14 may be formed of a metal such as tungsten (W), etc. The FP plug 17, the gate plug 18, the source plug 19, and the connection part 41 are formed of tungsten.

Effects of the embodiment will now be described.

Figure 5A:
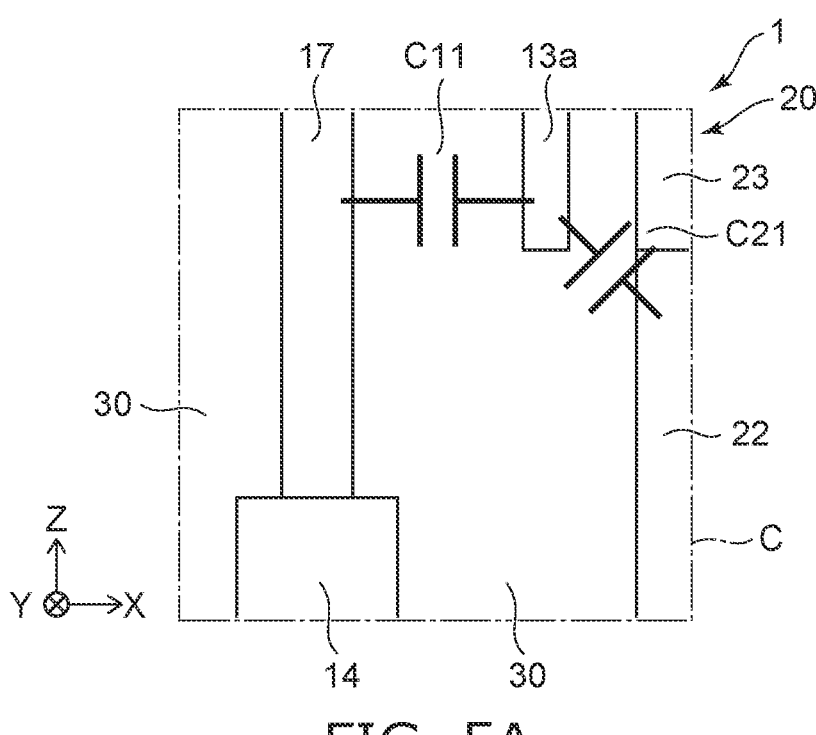
FIG. 5A is a cross-sectional view showing parasitic capacitances of the semiconductor device according to the first embodiment.
Figure 5B:
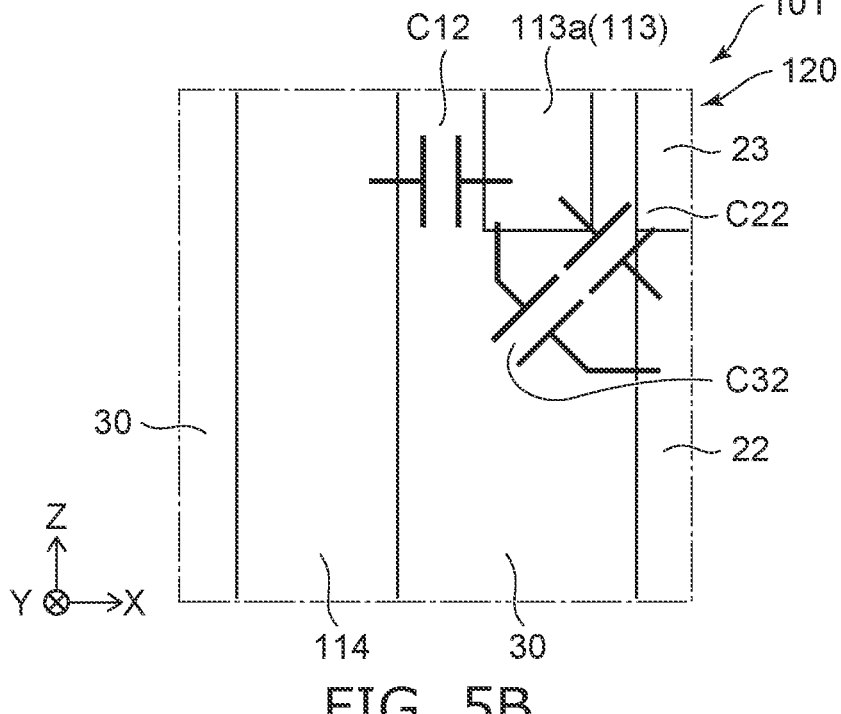
FIG. 5B is a cross-sectional view showing parasitic capacitances of a semiconductor device according to a comparative example.

FIG. 5A is a cross-sectional view showing parasitic capacitances of the semiconductor device according to the embodiment; and FIG. 5B is a cross-sectional view showing parasitic capacitances of a semiconductor device according to a comparative example.

FIG. 5A shows a region corresponding to region C of FIG. 3.

In the semiconductor device 1 according to the embodiment, the FP electrode 14 is located lower than the gate electrode 13; and the FP electrode 14 is connected to the source interconnect 15 by the FP plug 17. The FP plug 17 is narrower than the FP electrode 14; and the FP plug 17 is positioned inside the FP electrode 14 when viewed from above. The ring portion 13a and the extension portion 13b are located in the gate electrode 13; and the gate plug 18 is connected to the extension portion 13b. Therefore, the ring portion 13a can be thin in the radial direction of the ring portion 13a while ensuring a stable connection with the gate plug 18.

As a result, as shown in FIG. 5A, the distance between the FP plug 17 and the ring portion 13a of the gate electrode 13 can be increased, and a parasitic capacitance C11 between the FP plug 17 and the gate electrode 13 can be reduced. Also, the distance between the gate electrode 13 and the semiconductor part 20 can be increased, and a parasitic capacitance C21 between the gate electrode 13 and the semiconductor part 20 can be reduced.

In contrast, in the semiconductor device 101 according to the comparative example as shown in FIG. 5B, the upper end of a FP electrode 114 is at the same position as the upper surface 20a of the semiconductor part 20. Also, a gate electrode 113 does not include an extension portion; and the width in the radial direction of a ring portion 113a is wide enough to be stably connected with the gate plug 18. In such a case, the distance between the FP electrode 114 and the ring-shaped gate electrode 113 is short, and a parasitic capacitance C12 between the FP electrode 114 and the gate electrode 113 is large. The distance between the gate electrode 113 and a semiconductor part 120 is short, and a parasitic capacitance C22 between the gate electrode 113 and the semiconductor part 120 is large. In the semiconductor device 101 according to the comparative example, a parasitic capacitance C32 occurs between the semiconductor part 120 and the inner portion of the ring portion 113a of the gate electrode 113. As a result, the total parasitic capacitance occurring in the gate electrode 113 of the semiconductor device 101 according to the comparative example is greater than the total parasitic capacitance occurring in the gate electrode 13 of the semiconductor device 1 according to the embodiment.

In the semiconductor device 1 according to the embodiment as shown in FIG. 2, only one extension portion 13b is included in each gate electrode 13. Therefore, the parasitic capacitance that occurs between the extension portion 13b and the FP plug 17 can be suppressed. The extension portion 13b extends only from the upper portion of the inner side surface of the ring portion 13a and does not extend from the lower portion of the inner side surface of the ring portion 13a. The parasitic capacitance that occurs between the extension portion 13b and the FP plug 17 can be suppressed thereby.

Thus, according to the embodiment, the parasitic capacitance C11 between the gate electrode 13 and the FP plug 17 and the parasitic capacitance C21 between the gate electrode 13 and the semiconductor part 20 can be reduced, which can reduce the time necessary to charge and discharge the gate electrode 13, and can increase the speed of the semiconductor device 1.

Second Embodiment

Figure 6:
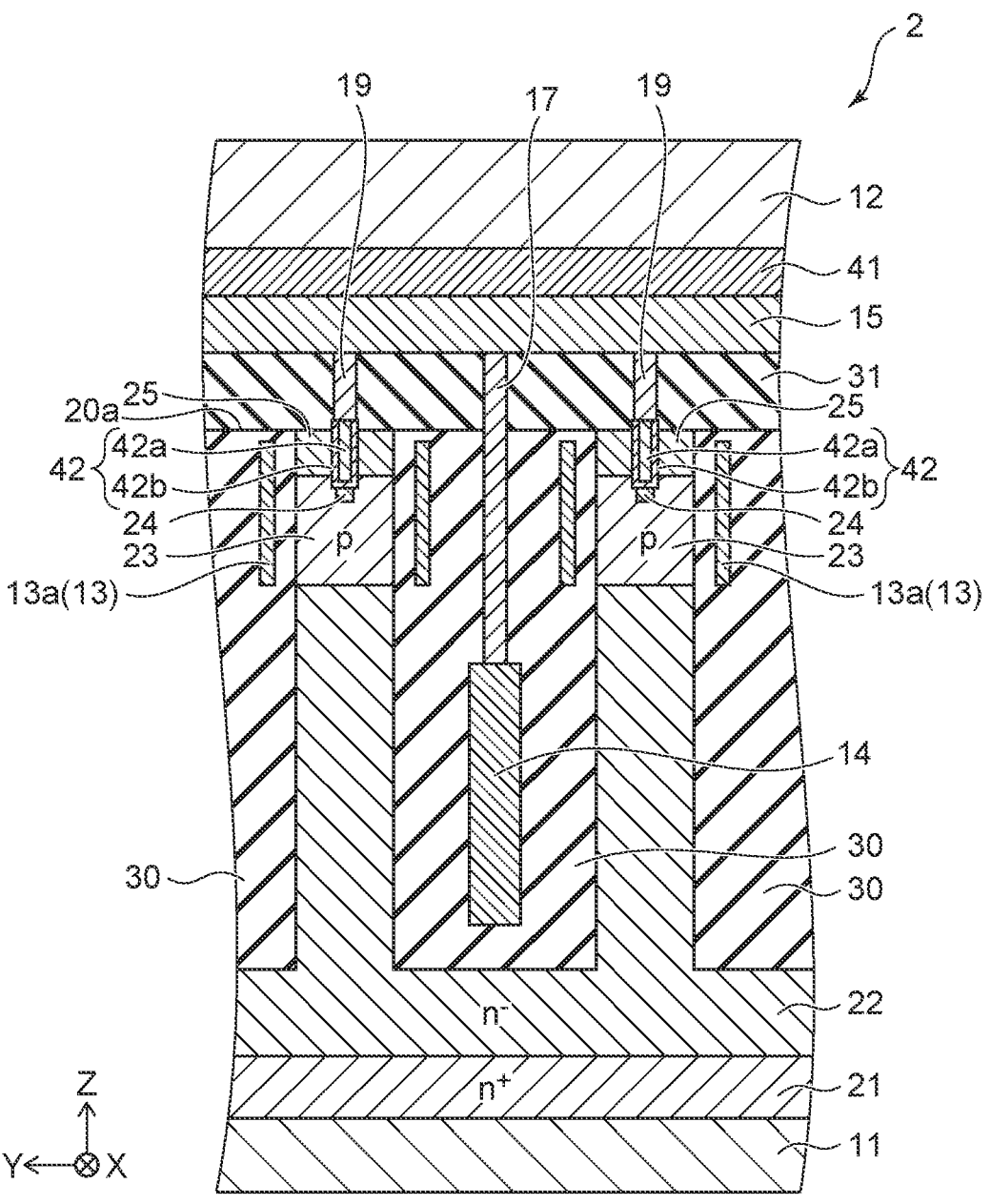
FIG. 6 is a cross-sectional view showing a semiconductor device according to a second embodiment.

FIG. 6 is a cross-sectional view showing a semiconductor device according to the embodiment.

FIG. 6 is a cross section corresponding to FIG. 4 of the first embodiment.

In the semiconductor device 2 according to the embodiment as shown in FIG. 6, a metal member 42 is located in the upper layer portion of the semiconductor part 20. The metal member 42 includes a main part 42a, and a barrier layer 42b located on the lower surface and on the side surface of the main part 42a. The main part 42a is made of, for example, tungsten; and the barrier layer 42b is made of, for example, a two-layer film in which a titanium (Ti) layer and a titanium nitride (TiN) layer are stacked. The titanium layer of the barrier layer 42b contacts the semiconductor part 20; and the titanium nitride layer of the barrier layer 42b contacts the main part 42a.

The metal member 42 is located at a position corresponding to the upper portion of the contact layer 24 of the semiconductor device 1 according to the first embodiment. The upper portion of the metal member 42 protrudes upward from the upper surface 20a of the semiconductor part 20.

The lower surface of the metal member 42 contacts the contact layer 24; the lower portion of the side surface of the metal member 42 contacts the base layer 23; and the upper portion of the side surface of the metal member 42 contacts the source layer 25. The lower end of the source plug 19 contacts the upper surface of the metal member 42. Thereby, the source electrode 12 is connected to the contact layer 24 and the source layer 25 via the connection part 41, the source interconnect 15, the source plug 19, and the metal member 42. The metal member 42 is provided over the entire contact layer 24. Therefore, the metal member 42 has a honeycomb shape when viewed from above.

According to the embodiment, the on-resistance of the semiconductor device 2 can be reduced by providing the metal member 42. According to the embodiment, holes can be discharged via the metal member 42 when avalanche breakdown occurs. Compared with the semiconductor device 1 according to the first embodiment, the rise of the potential of the base layer 23 when avalanche breakdown occurs can be suppressed thereby. As a result, the operation of the n-p-n parasitic bipolar transistor made of the source layer 25, the base layer 23, and the drift layer 22 can be suppressed, and the avalanche resistance is improved. Otherwise, the configuration and the effects of the embodiment are similar to those of the first embodiment.

Third Embodiment

Figure 7:
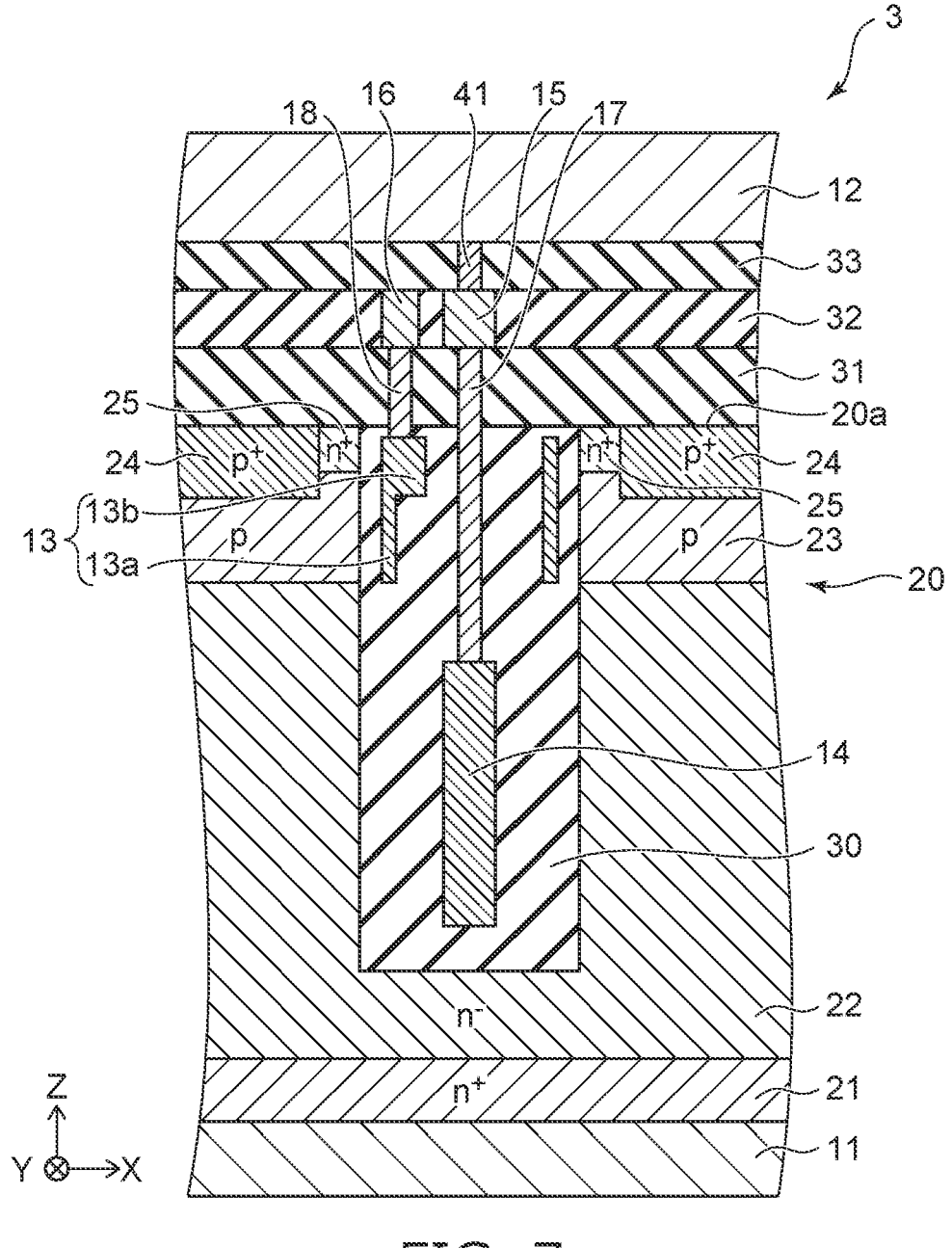
FIG. 7 is a cross-sectional view showing a semiconductor device according to a third embodiment.

FIG. 7 is a cross-sectional view showing a semiconductor device according to the embodiment.

FIG. 7 is a cross section corresponding to FIG. 3 of the first embodiment.

In the semiconductor device 3 according to the embodiment as shown in FIG. 7, the source interconnect 15 and the gate interconnect 16 are formed of tungsten. Accordingly, compared with the semiconductor device 1 according to the first embodiment, the source interconnect 15 and the gate interconnect 16 can be thin. Although the thicknesses of the source interconnect 15 and the gate interconnect 16 made of aluminum or copper are 500 nm in the semiconductor device 1 of an example, the thicknesses of the source interconnect 15 and the gate interconnect 16 made of tungsten are 150 nm in the semiconductor device 3. Otherwise, the configuration and the effects of the embodiment are similar to those of the first embodiment.

Fourth Embodiment

Figure 8:
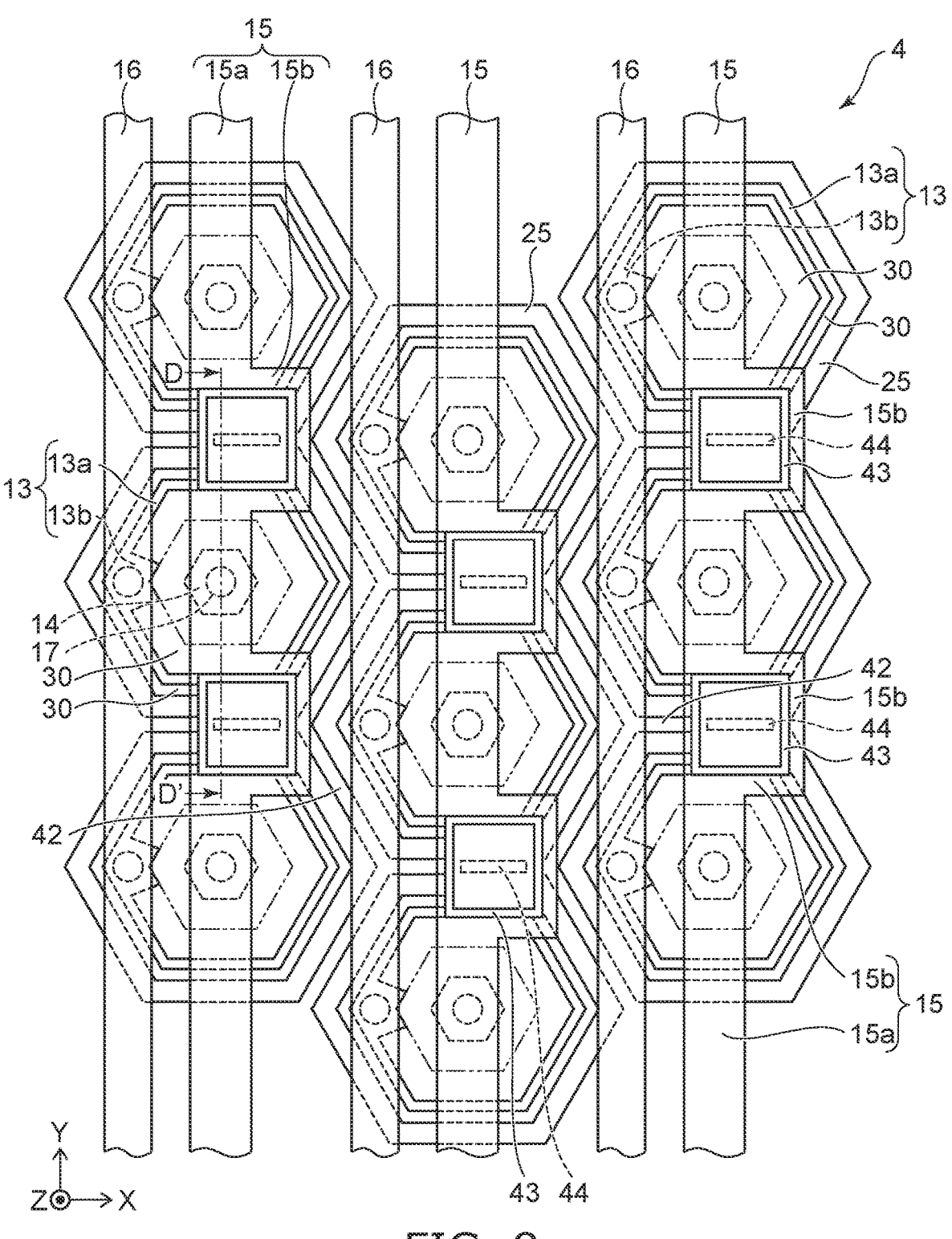
FIG. 8 is a top view showing a semiconductor device according to a fourth embodiment.

FIG. 8 is a top view showing a semiconductor device according to the embodiment.

Figure 9:
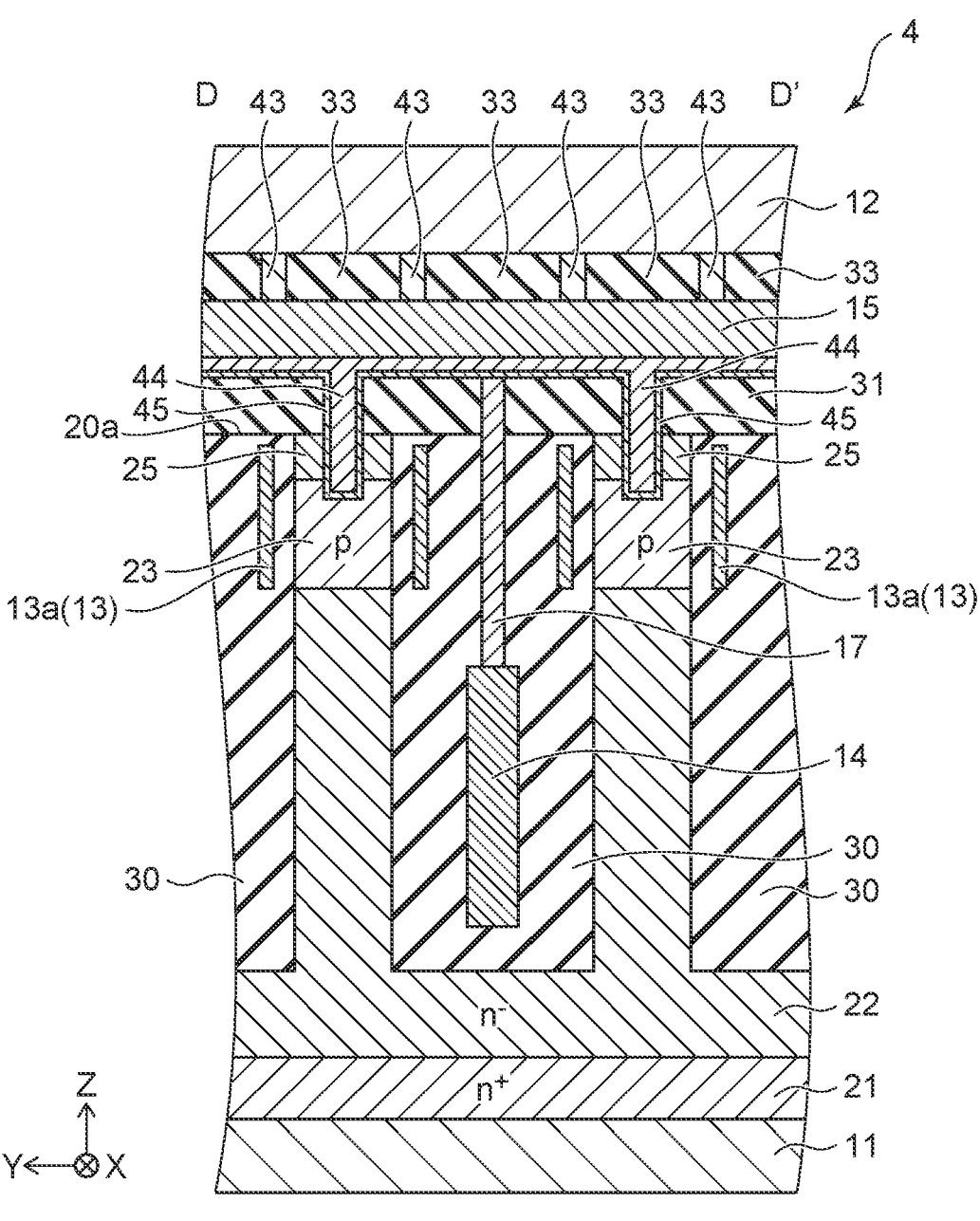
FIG. 9 is a cross-sectional view along line D-D' shown in FIG. 8.

FIG. 9 is a cross-sectional view along line D-D' shown in FIG. 8.

As shown in FIGS. 8 and 9, the semiconductor device 4 according to the embodiment differs from the semiconductor device 2 according to the second embodiment in that the source interconnect 15 includes an interconnect portion 15a and an extension portion 15b, a tubular connection part 43 is included instead of the line-shaped connection part 41, and a metal member 44 and a metal layer 45 are included instead of the pillar-shaped source plug 19, the honeycomb-shaped contact layer 24, and the honeycomb-shaped metal member 42.

The extension portion 15b of the source interconnect 15 extends in the X-direction from the interconnect portion 15a extending in the Y-direction. The extension portion 15b is located at a position including the region directly above the region between the insulating members 30 next to each other in the Y-direction. For example, the source interconnect 15 is formed of aluminum.

The connection part 43 has a quadrilateral tubular shape that extends in the Z-direction. The upper end of the connection part 43 contacts the source electrode 12; and the lower end of the connection part 43 contacts the interconnect portion 15a and the extension portion 15b of the source interconnect 15. The connection part 43 is located inside the source interconnect 15 when viewed from above.

For example, the metal member 44 is made of tungsten. The upper portion of the metal member 44 has a band shape extending in the Y-direction and contacts the entire lower surface of the source interconnect 15. The lower portion of the metal member 44 has a plate shape spreading along the XZ plane. The metal member 44 is located inside the region surrounded with the connection part 43 when viewed from above.

The metal layer 45 is located on the side surface and on the lower surface of the metal member 44. The metal layer 45 is, for example, a two-layer film in which a titanium layer and a titanium nitride layer are stacked. The titanium layer of the metal layer 45 contacts the semiconductor part 20; and the titanium nitride layer of the metal layer 45 contacts the metal member 44. The contact layer 24 is not included in the semiconductor device 4; and the lower end of the metal member 44 is connected to the base layer 23 via the metal layer 45. Otherwise, the configuration and the effects of the embodiment are similar to those of the second embodiment.

Fifth Embodiment

Figure 10:
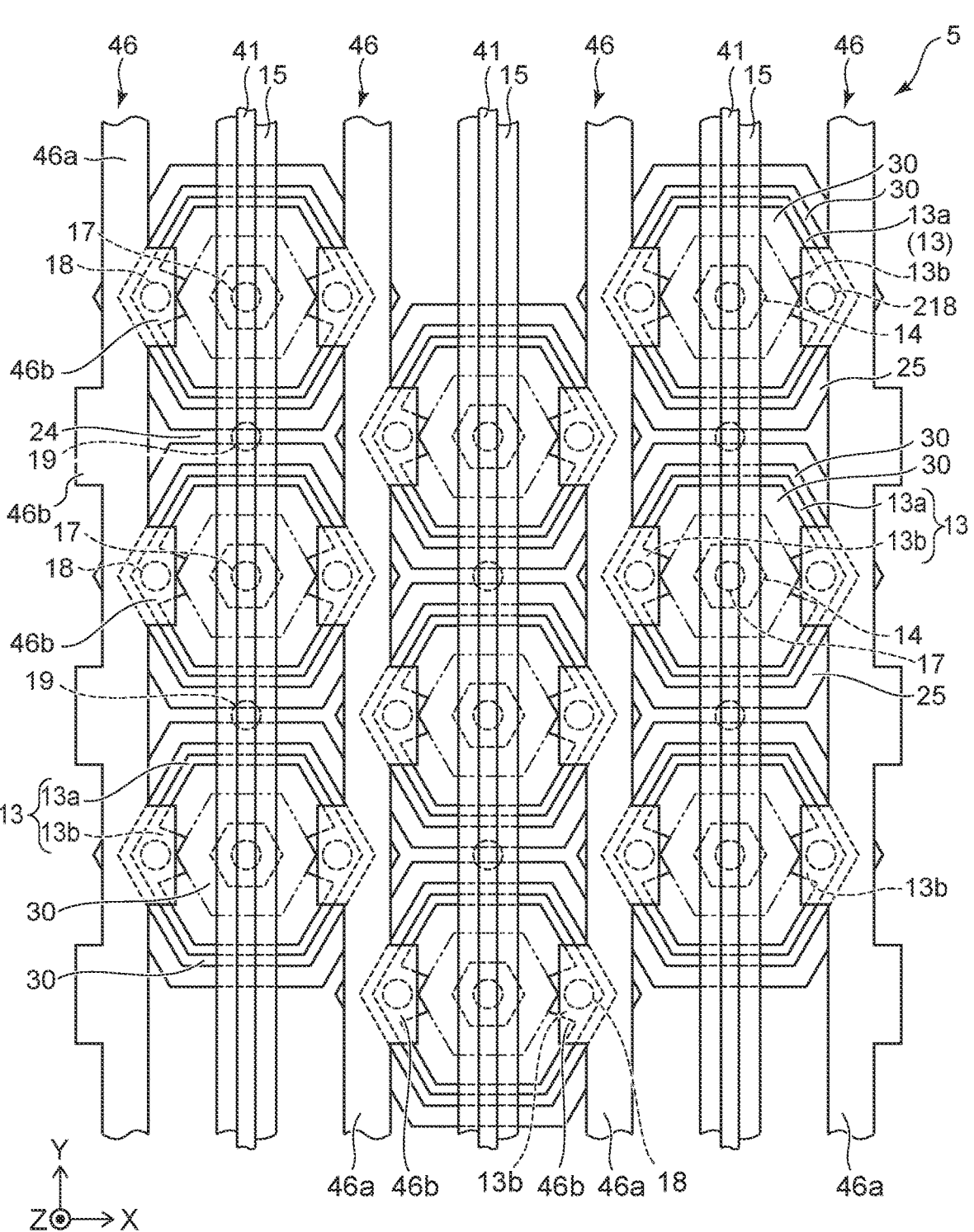
FIG. 10 is a top view showing a semiconductor device according to a fifth embodiment.

FIG. 10 is a top view showing a semiconductor device according to the embodiment.

As shown in FIG. 10, the semiconductor device 5 according to the embodiment differs from the semiconductor device 1 according to the first embodiment in that two extension portions 13b are provided in each gate electrode 13. The extension portions 13b are connected to gate interconnects 46 via the gate plugs 18.

The shape of the gate interconnect 46 is different from the shape of the gate interconnect 16 of the first embodiment. The gate interconnect 46 includes an interconnect portion 46a that extends in the Y-direction, and extension portions 46b that alternately extend from the interconnect portion 46a toward the two X-direction sides. The extension portion 46b is located in a region directly above the gate plug 18. Thereby, the lower end of the gate plug 18 is connected to the extension portion 13b of the gate electrode 13; and the upper end of the gate plug 18 is connected to the extension portion 46b of the gate interconnect 46.

According to the embodiment, compared with the first embodiment, the resistance between the gate interconnect 46 and the gate electrode 13 can be reduced. Otherwise, the configuration and the effects of the embodiment are similar to those of the first embodiment. The extension portions 13b of the gate electrode 13 are not limited to one or two, and may be three or more. Although the resistance between the gate interconnect 16 and the gate electrode 13 decreases as the number of the extension portions 13b increases, the parasitic capacitance between the gate electrode 13 and the FP plug 17 increases. It is therefore favorable for the number of the extension portions 13b to be one or two.

Sixth Embodiment

The embodiment is an example of a method for manufacturing the semiconductor device according to the first embodiment.

FIGS. 11A to 13C are process cross-sectional views showing the method for manufacturing the semiconductor device according to the embodiment.

Figure 11A:
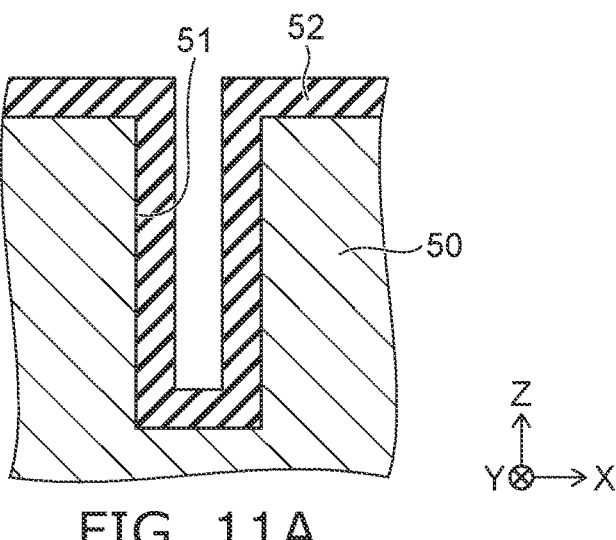
FIGS. 11A to 13C are process cross-sectional views showing a method for manufacturing a semiconductor device according to a sixth embodiment.

First, as shown in FIG. 11A, a semiconductor substrate 50 is made by epitaxially growing an n⁻-type silicon layer on an n-type silicon wafer. Then, thermal oxidation treatment of the semiconductor substrate 50 is performed. Then, for example, multiple trenches 51 are formed in the upper surface of the semiconductor substrate 50 by lithography. The shape of the trench 51 is, for example, hexagonal when viewed from above. The multiple trenches 51 are periodically arranged in the Y-direction, in a direction tilted +60 degrees with respect to the Y-direction, and in a direction tilted –60 degrees with respect to the Y-direction. Then, thermal oxidation treatment is re-performed. Thereby, a thermal oxide film 52 is formed on the front surface of the semiconductor substrate 50. The thermal oxide film 52 is formed also on the inner surface of the trench 51.

Figure 11B:
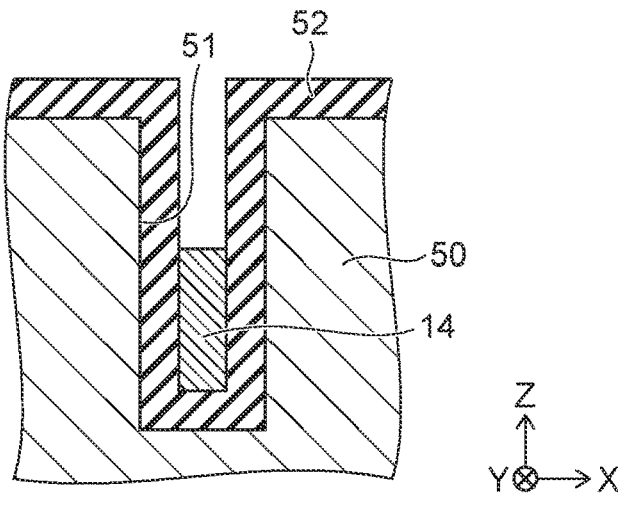

Then, as shown in FIG. 11B, silicon that includes an impurity is deposited by, for example, CVD (Chemical Vapor Deposition). Then, the silicon that is on the upper surface of the semiconductor substrate 50 is removed by performing CMP (Chemical Mechanical Polishing). Then, the silicon that is in the upper portion of the trench 51 is removed by performing CDE (Chemical Dry Etching) or RIE (Reactive Ion Etching). Thereby, the FP electrode 14 that is made of polysilicon is formed in the lower portion of the trench 51.

Figure 11C:
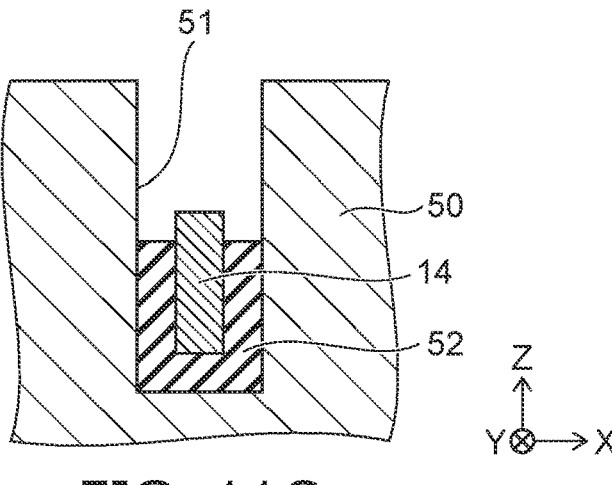

Continuing as shown in FIG. 11C, etch-back of the thermal oxide film 52 is performed to remove the thermal oxide film 52 on the upper surface of the semiconductor substrate 50 and remove the thermal oxide film 52 from the upper portion of the trench 51. The thermal oxide film 52 is caused to remain in the lower portion of the trench 51. At this time, the upper portion of the FP electrode 14 protrudes from the thermal oxide film 52.

Figure 12A:
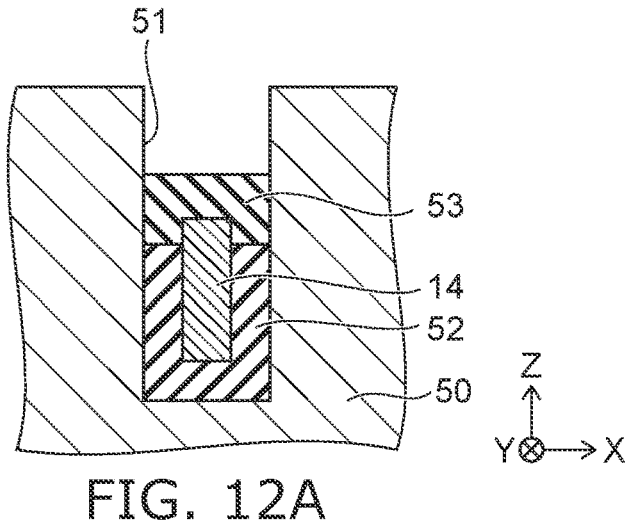

Then, as shown in FIG. 12A, silicon oxide is deposited by, for example, CVD. Subsequently, CMP is performed. The silicon oxide that is on the upper surface of the semiconductor substrate 50 is removed thereby. Then, wet processing that uses DHF (Diluted Hydrofluoric Acid) or BHF (Buffered Hydrofluoric Acid) is performed. Thereby, the silicon oxide is removed from the upper portion of the trench 51. Thus, a silicon oxide member 53 is formed inside the trench 51. The silicon oxide member 53 covers the upper portion of the FP electrode 14.

Figure 12B:
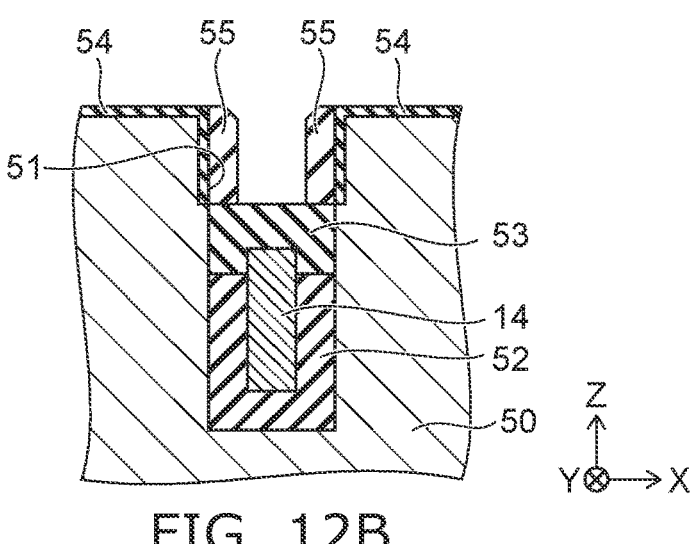

Continuing as shown in FIG. 12B, a thin oxide film 54 is formed. Then, silicon nitride (SiN) is deposited. Then, etch-back of the silicon nitride is performed using RIE. Thus, a sidewall 55 that is made of silicon nitride is formed along the inner surface of the trench 51 on the silicon oxide member 53 in the trench 51.

Figure 12C:
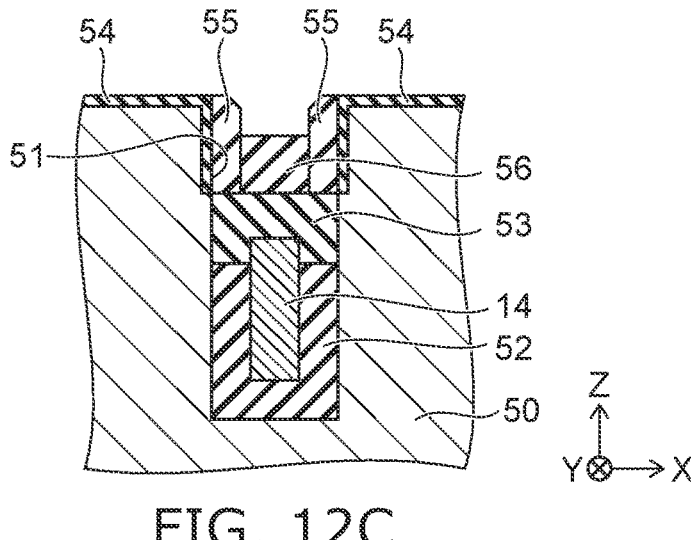

Then, as shown in FIG. 12C, silicon oxide is deposited by, for example, CVD. Then, wet processing that uses DHF or BHF is performed. Thereby, a silicon oxide member 56 is formed in the lower portion of the space of the trench 51 surrounded with the sidewall 55.

Figure 13A:
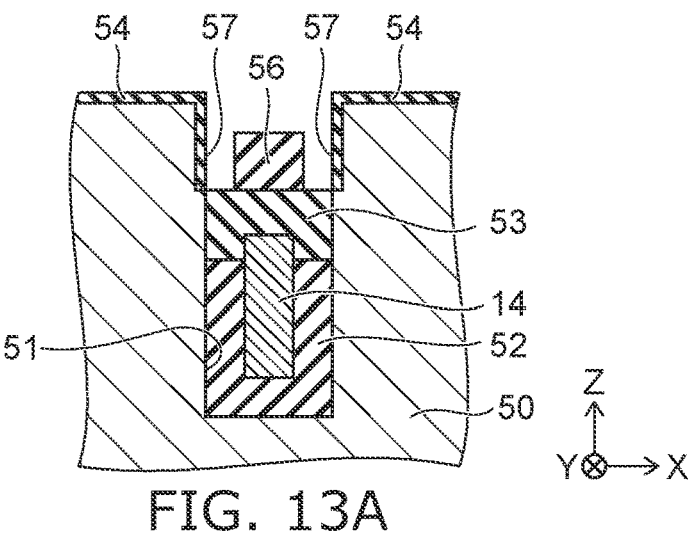

Continuing as shown in FIG. 13A, wet processing that uses hot phosphoric acid is performed. The sidewall 55 is removed thereby, and a ring-shaped space 57 is formed at the periphery of the silicon oxide member 56.

Figure 13B:
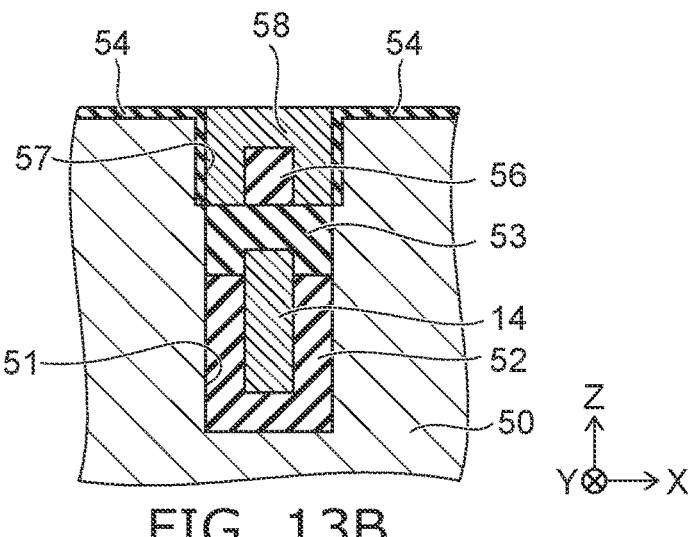

Then, as shown in FIG. 13B, silicon that includes an impurity is deposited. Then, the silicon that is on the semiconductor substrate 50 is removed by performing CMP and by performing CDE if necessary. Thereby, a silicon member 58 is formed in the upper portion of the trench 51. The lower portion of the silicon member 58 has a ring shape filled into the space 57. The upper portion of the silicon member 58 has a plate shape, e.g., a hexagonal plate shape.

Figure 13C:
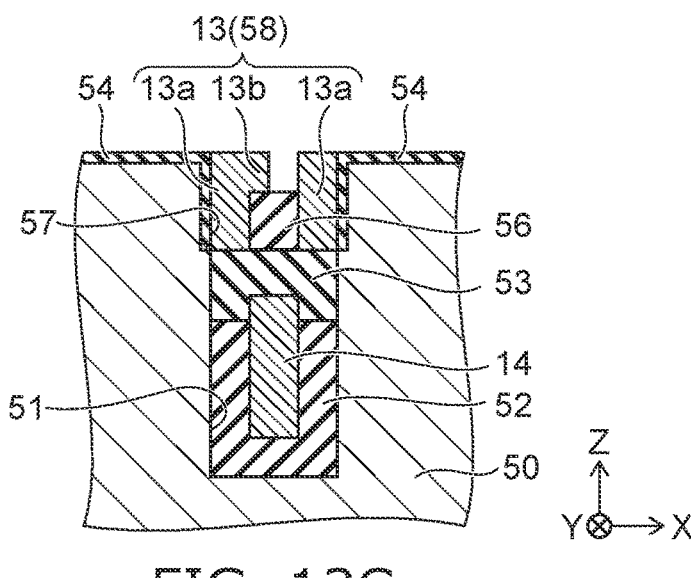

Continuing as shown in FIG. 13C, for example, the silicon member 58 is patterned by lithography and RIE. A portion of the silicon member 58 located on the silicon oxide member 56 is removed thereby. Thus, the gate electrode 13 that is made of polysilicon is formed. At this time, the portion of the silicon member 58 filled into the space 57 becomes the lower portion of the ring portion 13a. The portion of the silicon member 58 located on the space 57 becomes the upper portion of the ring portion 13a. The remainder of the portion of the silicon member 58 located on the silicon oxide member 56 becomes the extension portion 13b.

Then, as shown in FIGS. 1 to 4, the base layer 23, the contact layer 24, and the source layer 25 are formed by ion-implanting impurities from the upper surface side of the semiconductor substrate 50. Then, the drain electrode 11 is formed on the lower surface of the semiconductor substrate 50. The insulating film 31 is formed on the semiconductor substrate 50; and the FP plug 17, the gate plug 18, and the source plug 19 are formed to extend through the insulating film 31 in the Z-direction. Then, the insulating film 32 is formed on the insulating film 31; and the source interconnect 15 and the gate interconnect 16 are formed to extend through the insulating film 32 in the Z-direction. Then, the insulating film 33 is formed on the insulating film 32; and the connection part 41 is formed to extend through the insulating film 33 in the Z-direction. Then, the source electrode 12 is formed on the insulating film 33.

Continuing, the semiconductor substrate 50 is diced. Thereby, the singulated semiconductor substrate 50 becomes the semiconductor parts 20. The portion of the semiconductor substrate 50 that is the silicon wafer becomes the drain layer 21; and the portion of the silicon layer that is not used to form the base layer 23, the contact layer 24, and the source layer 25 becomes the drift layer 22. The thermal oxide film 52, the silicon oxide member 53, the oxide film 54, and the silicon oxide member 56 in the trench 51 become the insulating member 30. Thus, the semiconductor device 1 is manufactured.

Seventh Embodiment

The embodiment is another example of the method for manufacturing the semiconductor device according to the first embodiment.

Figures 14A, 14B, 14C:
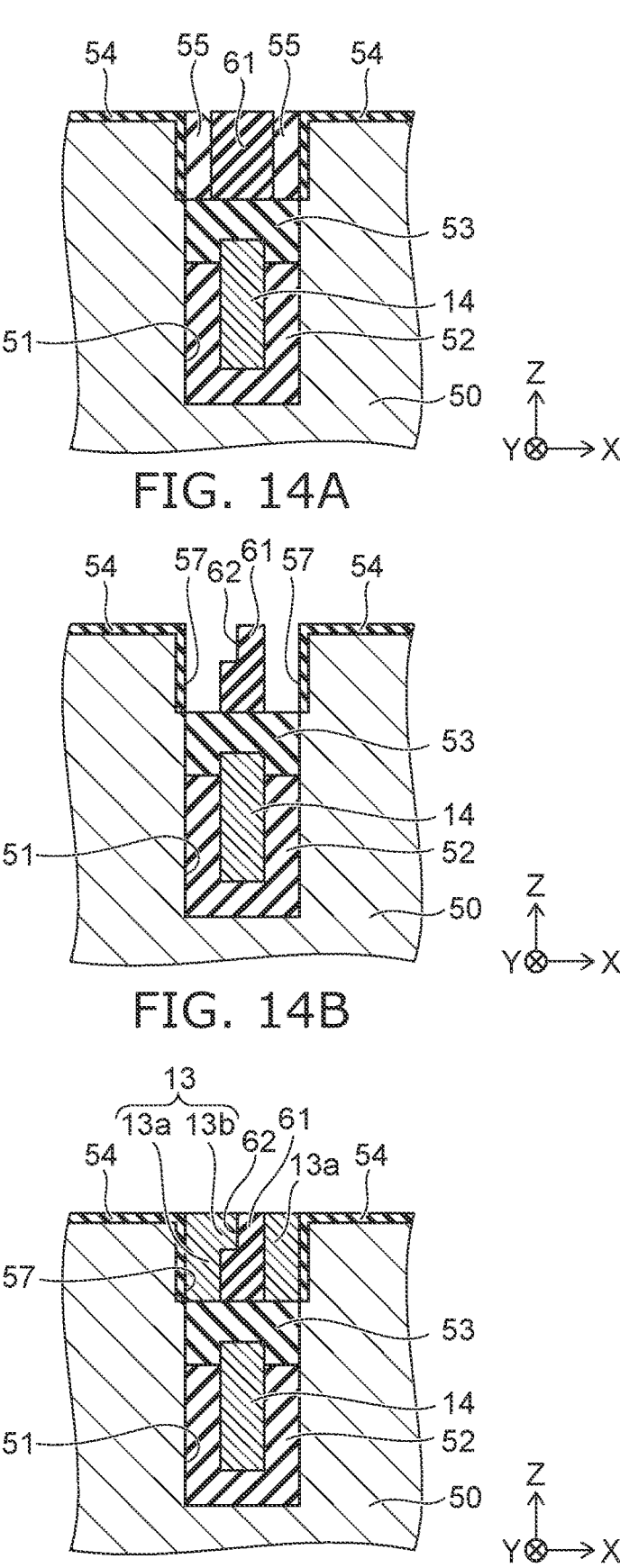
FIGS. 14A to 14C are process cross-sectional views showing a method for manufacturing a semiconductor device according to a seventh embodiment.

FIGS. 14A to 14C are process cross-sectional views showing the method for manufacturing the semiconductor device according to the embodiment.

First, the processes shown in FIGS. 11A to 12B are performed.

Then, as shown in FIG. 14A, silicon oxide is deposited by, for example, CVD. Then, CMP is performed. Thereby, a silicon oxide member 61 is formed in the entire space of the trench 51 surrounded with the sidewall 55.

Continuing as shown in FIG. 14B, wet processing that uses hot phosphoric acid is performed. Then, thermal oxidation treatment is performed. The sidewall 55 is removed thereby, and the ring-shaped space 57 is formed at the periphery of the silicon oxide member 61. Then, for example, a notch 62 is formed in a portion of the upper portion of the silicon oxide member 61 by lithography and RIE.

Then, silicon that includes an impurity is deposited as shown in FIG. 14C. Then, the silicon that is on the semiconductor substrate 50 is removed by performing CMP and by performing CDE if necessary. Thereby, the gate electrode 13 that is made of silicon is formed in the upper portion of the trench 51. At this time, the ring portion 13a of the gate electrode 13 is formed of the silicon filled into the space 57; and the extension portion 13b of the gate electrode 13 is formed of the silicon filled into the notch 62. Thereafter, the manufacturing method is similar to that of the sixth embodiment.

Eighth Embodiment

The embodiment is another example of the method for manufacturing the semiconductor device according to the first embodiment.

FIGS. 15A to 16C are process cross-sectional views showing the method for manufacturing the semiconductor device according to the embodiment.

Figure 15A:
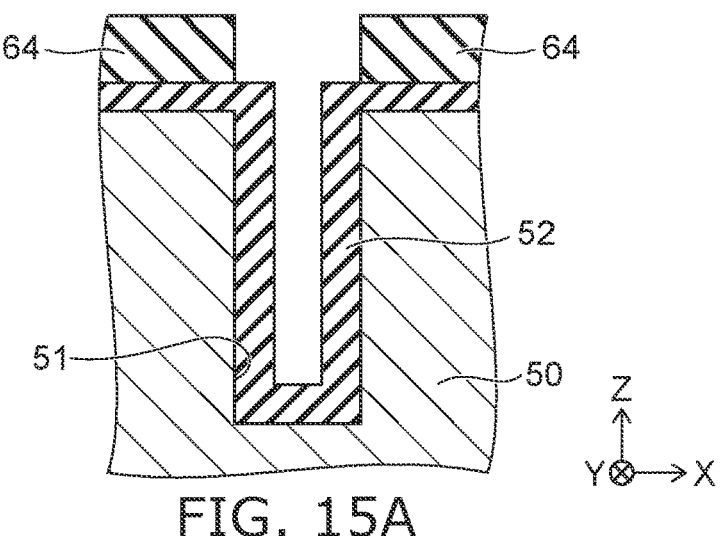

First, thermal oxidation treatment of the semiconductor substrate 50 is performed as shown in FIG. 15A. Then, a silicon nitride film 64 is formed by depositing silicon nitride. Then, the trench 51 is formed in the upper surface of the semiconductor substrate 50 by, for example, lithography. Then, thermal oxidation treatment is re-performed. Thus, the thermal oxide film 52 is formed on the front surface of the semiconductor substrate 50 and on the inner surface of the trench 51. The silicon nitride film 64 is located on the thermal oxide film 52 in the region of the upper surface of the semiconductor substrate 50 other than the trench 51.

Figure 15B:
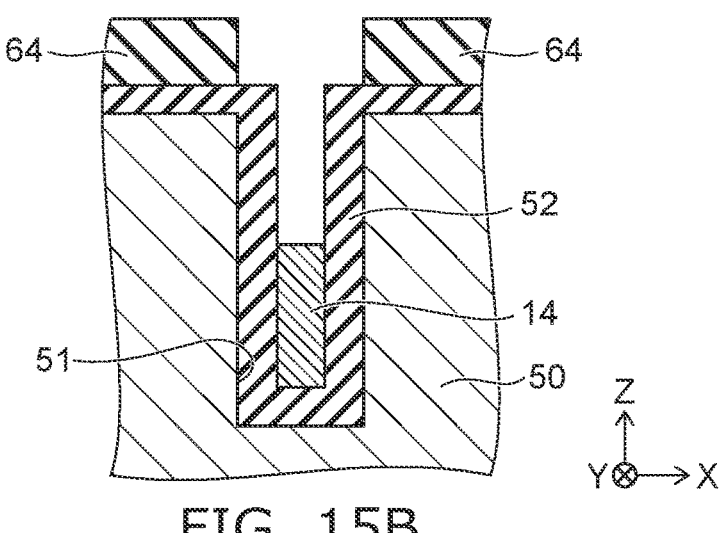

Then, as shown in FIG. 15B, silicon that includes an impurity is deposited by, for example, CVD. Then, the silicon that is on the silicon nitride film 64 is removed by performing CMP. Then, the silicon that is in the upper portion of the trench 51 is removed by performing CDE. Thereby, the FP electrode 14 that is made of polysilicon is formed in the lower portion of the trench 51.

Figure 15C:
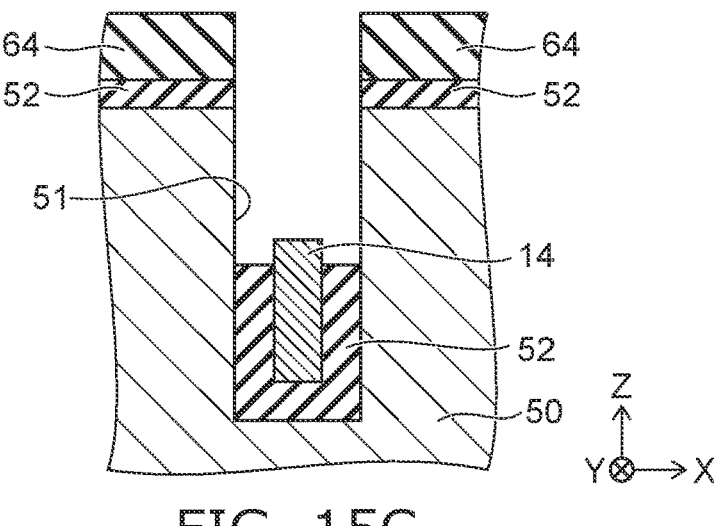

Continuing as shown in FIG. 15C, etch-back of the thermal oxide film 52 is performed to remove the thermal oxide film 52 from the upper portion of the trench 51. The thermal oxide film 52 is caused to remain in the lower portion of the trench 51. At this time, the upper portion of the FP electrode 14 protrudes from the thermal oxide film 52.

Figures 16A, 16B, 16C:
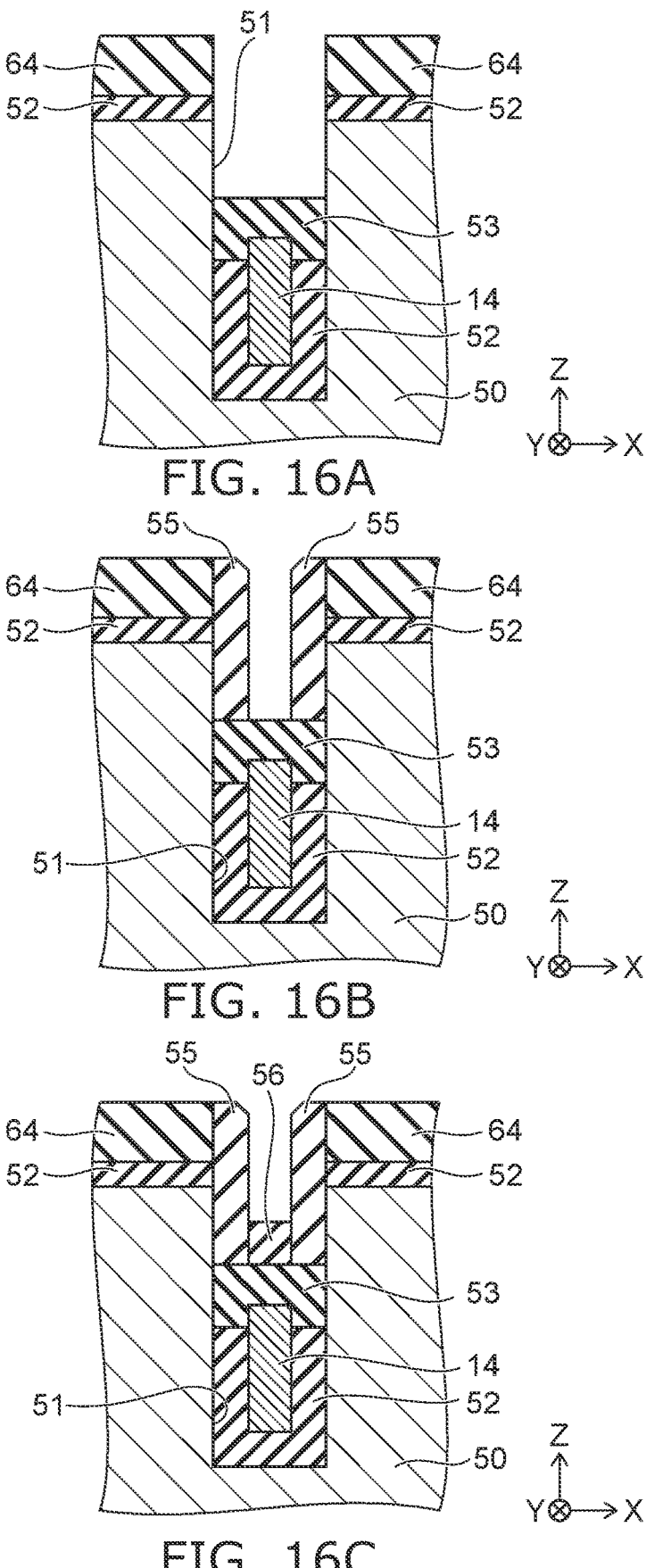

Then, as shown in FIG. 16A, oxidation treatment of the FP electrode 14 is performed. Then, silicon oxide is deposited by, for example, CVD. Subsequently, CMP is performed. The silicon oxide that is on the upper surface of the semiconductor substrate 50 is removed thereby. Then, wet processing that uses DHF is performed. The silicon oxide that is in the upper portion of the trench 51 is removed thereby. Thus, the silicon oxide member 53 is formed in the trench 51. The silicon oxide member 53 covers the upper portion of the FP electrode 14.

Continuing as shown in FIG. 16B, silicon nitride is deposited by LP-CVD (Low Pressure Chemical Vapor Deposition). Then, etch-back of the silicon nitride is performed by RIE. Thus, the sidewall 55 that is made of silicon nitride is formed along the inner surface of the trench 51 on the silicon oxide member 53 in the trench 51.

Then, as shown in FIG. 16C, for example, wet processing that uses DHF is performed after depositing silicon oxide by CVD. Thereby, the silicon oxide member 56 is formed in the lower portion of the space of the trench 51 surrounded with the sidewall 55.

Continuing, the processes shown in FIGS. 13A to 13C are performed. Thereafter, the processes are similar to those of the sixth embodiment. The semiconductor device 1 can be manufactured thereby.

Ninth Embodiment

The embodiment is another example of the method for manufacturing the semiconductor device according to the first embodiment.

FIGS. 17A to 19C are process cross-sectional views showing the method for manufacturing the semiconductor device according to the embodiment.

First, the process shown in FIG. 11A is performed.

Figure 17A:
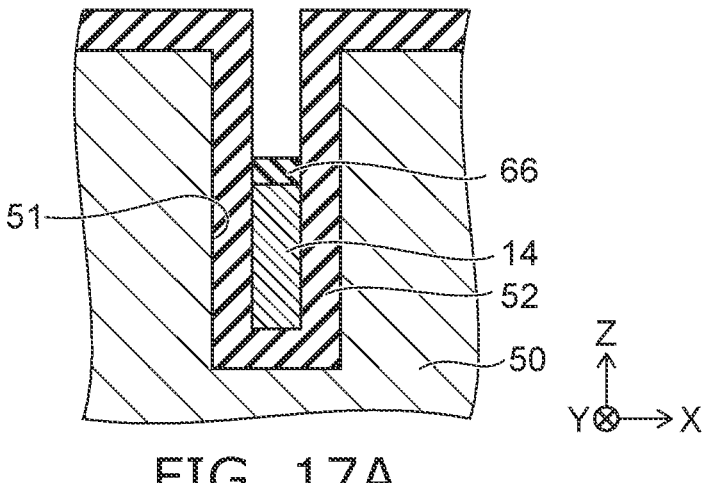

Then, oxidation treatment is performed as shown in FIG. 17A. Thereby, a silicon oxide film 66 is formed on the upper surface of the FP electrode 14.

Figure 17B:
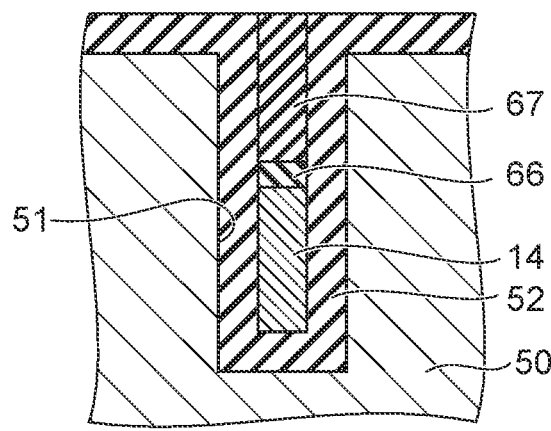

Continuing as shown in FIG. 17B, BPSG (Boron Phosphorous Silicate Glass) is deposited, and etching or CMP is performed. Thereby, a BPSG member 67 is formed on the silicon oxide film 66 in the trench 51.

Figure 17C:
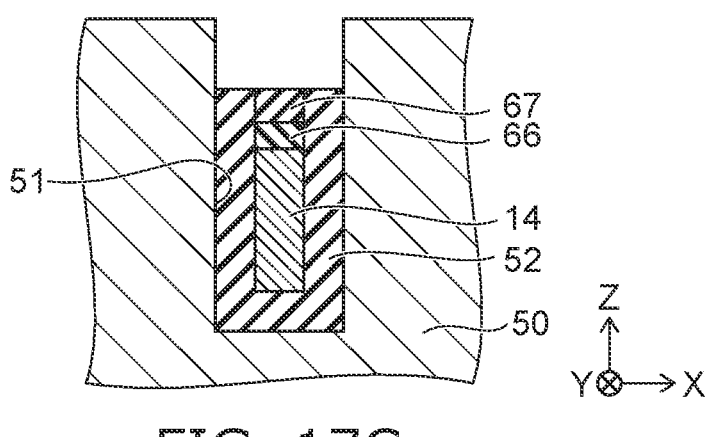

Then, as shown in FIG. 17C, the thermal oxide film 52 and the BPSG member 67 that are on the upper surface of the semiconductor substrate 50 and in the upper portion of the trench 51 are removed by etching.

Figure 18A:
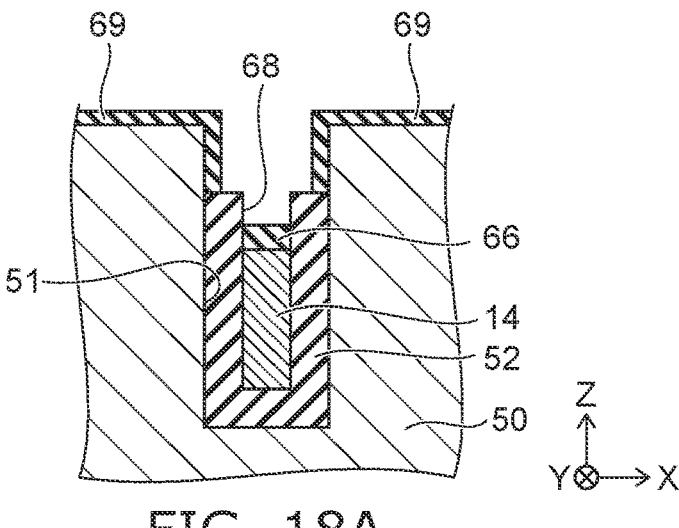

Continuing as shown in FIG. 18A, the BPSG member 67 is removed by wet processing using DHF. Thereby, a space 68 is formed after removing the BPSG member 67. Then, a silicon oxide film 69 is formed on the exposed surface of the semiconductor substrate 50 by performing oxidation treatment.

Figure 18B:
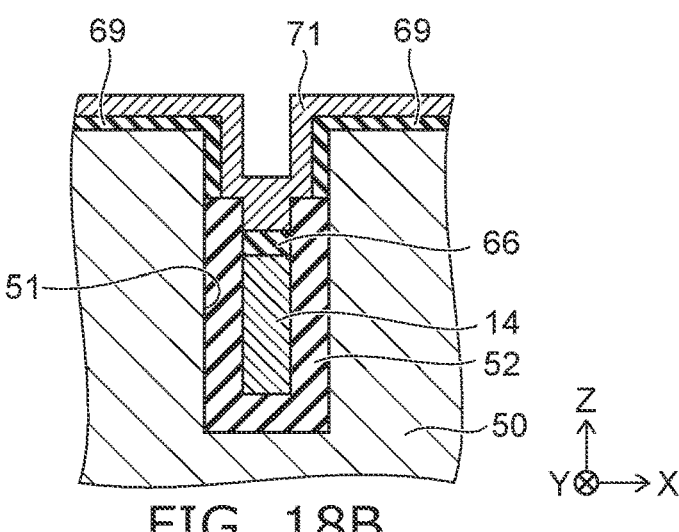

Then, as shown in FIG. 18B, a polysilicon film 71 is formed by depositing silicon.

Figure 18C:
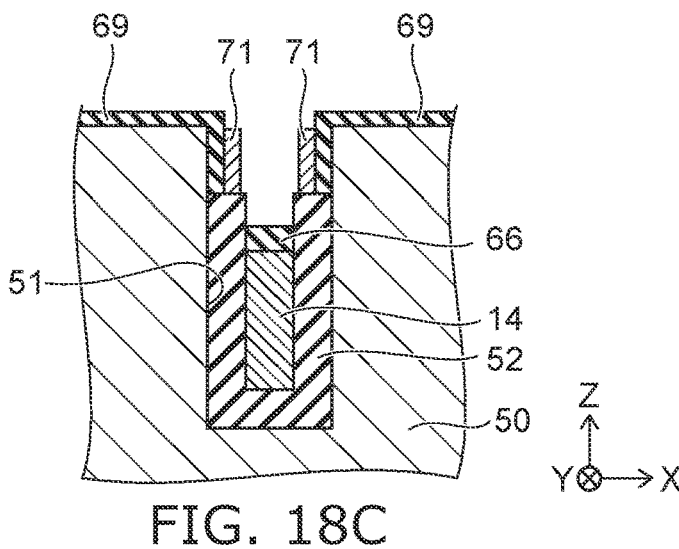

Continuing as shown in FIG. 18C, RIE of the polysilicon film 71 is performed. The greater part of the polysilicon film 71 is removed thereby, and a ring shape remains along the inner surface of the trench 51 in the upper portion of the trench 51.

Figures 19A, 19B, 19C:
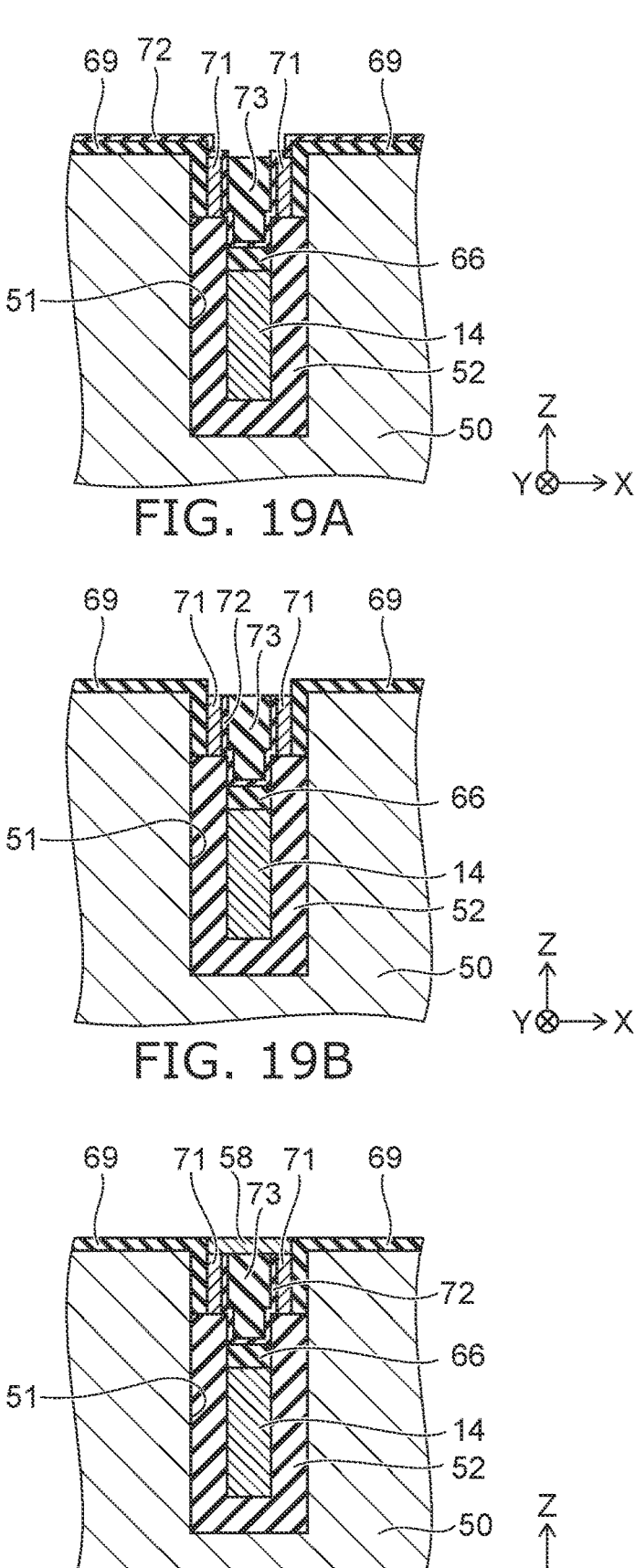

Then, as shown in FIG. 19A, a silicon nitride film 72 is formed by depositing silicon nitride. Then, an insulating film 73 is formed by depositing BPSG. Instead of BPSG, silicon oxide may be deposited by HDP-CVD (High Density Plasma Chemical Vapor Deposition), or a HARP (High-gain Avalanche Rushing amorphous Photoconductor) may be deposited. Then, the upper portion of the insulating film 73 is removed by performing wet processing using BHF.

Continuing as shown in FIG. 19B, the exposed portion of the silicon nitride film 72 is removed by performing CDE.

Then, as shown in FIG. 19C, silicon that includes an impurity is deposited by LP-CVD. Then, the silicon that is on the semiconductor substrate 50 is removed by performing CMP. Thereby, the silicon member 58 is formed in the upper portion of the trench 51.

Continuing, the process shown in FIG. 13C is performed. Thereby, the gate electrode 13 is formed from the polysilicon film 71 and the silicon member 58. Thereafter, the processes are similar to those of the sixth embodiment. Thus, the semiconductor device is manufactured. Otherwise, the manufacturing method of the embodiment is similar to that of the sixth embodiment.

Although an example of manufacturing the semiconductor device 1 according to the first embodiment is described in the sixth to ninth embodiments, this is similar for methods for manufacturing the semiconductor devices according to the second to fifth embodiments as well.

According to the embodiments described above, a semiconductor device can be realized in which the parasitic capacitance can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

Embodiments include the following aspects.

Note 1

A semiconductor device, comprising:

a first electrode;

a second electrode located on the first electrode;

a semiconductor part located between the first electrode and the second electrode;

a first interconnect located between the semiconductor part and the second electrode;

a third electrode located in the semiconductor part and separated from the semiconductor part, the third electrode including a ring portion, and an extension portion extending from the ring portion into an interior of the ring portion;

a fourth electrode located lower than the third electrode in the semiconductor part, the fourth electrode being located in the interior of the ring portion in a plane perpendicular to a vertical direction, the fourth electrode being separated from the semiconductor part;

a first plug connecting the second electrode to the fourth electrode; and a second plug connecting the first interconnect to the extension portion.

Note 2

The device according to note 1, wherein the third electrode includes only one of the extension portions.

Note 3

The device according to note 1 or 2, wherein the extension portion extends in a first direction from the ring portion, and the first plug and the second plug are arranged in the first direction.

Note 4

The device according to any one of notes 1-3, wherein an outer edge of the first plug is aligned with an outer edge of the fourth electrode or is located inward of the outer edge of the fourth electrode in a plane perpendicular to the vertical direction.

Note 5

The device according to any one of notes 1-4, wherein a thickness in a radial direction of the ring portion is not less than 10 nm and not more than 50 nm.

Note 6

The device according to any one of notes 1-5, wherein the semiconductor part includes:

a first semiconductor layer connected to the first electrode, the first semiconductor layer being of a first conductivity type;

a second semiconductor layer located on the first semiconductor layer, the second semiconductor layer being of a second conductivity type; and a third semiconductor layer located on a portion of the second semiconductor layer, the third semiconductor layer being of the first conductivity type, and the ring portion faces the second semiconductor layer via an insulating member.

14

Note 7

The device according to note 6, further comprising:

a third plug connecting the second electrode to the second and third semiconductor layers, the first plug and the second plug being arranged in a first direction, the first direction crossing a second direction, the second direction being from the first plug toward the third plug, the first interconnect extending in the second direction.

Note 8

The device according to note 6, further comprising:

a metal member located in the semiconductor part, the metal member being connected to the second semiconductor layer, the third semiconductor layer, and the third plug.

Note 9

The device according to any one of notes 1-8, wherein the first plug and the second plug include tungsten, and the second electrode includes aluminum or copper.

Note 10

The device according to note 9, wherein the first interconnect includes aluminum or copper.

Note 11

The device according to note 9, wherein the first interconnect includes tungsten.

Note 12

The device according to any one of notes 1-11, wherein an outer edge of the ring portion is hexagonal in the plane perpendicular to the vertical direction.

What is claimed is:

1. A semiconductor device, comprising:

a first electrode;

a second electrode located above the first electrode;

a semiconductor part located between the first electrode and the second electrode;

a first interconnect located between the semiconductor part and the second electrode;

a third electrode located in the semiconductor part and separated from the semiconductor part, the third electrode including a ring portion, and an extension portion extending from a part of the ring portion that is less than an entirety of the ring portion, into an interior of the ring portion;

a fourth electrode located in the semiconductor part and located lower than the third electrode in a vertical direction, the fourth electrode being located in the interior of the ring portion in a plane perpendicular to the vertical direction, the fourth electrode being separated from the semiconductor part;

a first plug connecting the second electrode to the fourth electrode; and a second plug connecting the first interconnect to the extension portion.

2. The device according to claim 1, wherein the third electrode includes only one extension portion.

3. The device according to claim 1, wherein the extension portion extends in a first direction from the ring portion, and the first plug and the second plug are arranged in the first direction.

4. The device according to claim 1, wherein an outer edge of the first plug is aligned with an outer edge of the fourth electrode or is located inward of the outer edge of the fourth electrode in a plane perpendicular to the vertical direction.

5. The device according to claim 1, wherein a thickness in a radial direction of the ring portion is not less than 10 nm and not more than 50 nm.

6. The device according to claim 1,
wherein the semiconductor part includes:
  a first semiconductor layer connected to the first electrode, the first semiconductor layer being of a first conductivity type,
  a second semiconductor layer located on the first semiconductor layer, the second semiconductor layer being of a second conductivity type, and
  a third semiconductor layer located on a portion of the second semiconductor layer, the third semiconductor layer being of the first conductivity type, and
wherein the ring portion faces the second semiconductor layer via an insulating member.

7. The device according to claim 6, further comprising:
a third plug connecting the second electrode to the second and third semiconductor layers,
the first plug and the second plug being arranged in a first direction,
the first direction crossing a second direction,
the second direction being from the first plug toward the third plug,
the first interconnect extending in the second direction.

8. The device according to claim 6, further comprising:
a metal member located in the semiconductor part,
the metal member being connected to the second semiconductor layer, the third semiconductor layer, and a third plug.

9. The device according to claim 1, wherein
the first plug and the second plug include tungsten, and
the second electrode includes aluminum or copper.

10. The device according to claim 9, wherein the first interconnect includes aluminum or copper.

11. The device according to claim 9, wherein the first interconnect includes tungsten.

12. The device according to claim 1, wherein an outer edge of the ring portion is hexagonal in the plane perpendicular to the vertical direction.

13. The device according to claim 1, wherein the extension portion terminates at a free end disposed within the interior of the ring portion.

14. The device according to claim 1, wherein the extension portion is laterally surrounded by an insulating member disposed within the interior of the ring portion.

* * * * *